United States Patent
Warren et al.

(10) Patent No.: US 9,935,455 B2
(45) Date of Patent: Apr. 3, 2018

(54) MONITORING AND RECOVERABLE PROTECTION OF THERMOSTAT SWITCHING CIRCUITRY

(71) Applicant: Google LLC, Mountain View, CA (US)

(72) Inventors: Daniel Adam Warren, San Francisco, CA (US); Brian J. Conner, San Jose, CA (US); Ian C. Smith, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 379 days.

(21) Appl. No.: 14/106,544

(22) Filed: Dec. 13, 2013

(65) Prior Publication Data

US 2014/0175181 A1 Jun. 26, 2014

Related U.S. Application Data

(62) Division of application No. 13/624,882, filed on Sep. 21, 2012, now Pat. No. 8,659,302.

(51) Int. Cl.
*H02H 7/20* (2006.01)
*H05B 1/02* (2006.01)
(Continued)

(52) U.S. Cl.
CPC ........... *H02H 7/20* (2013.01); *F24D 19/1009* (2013.01); *G05D 23/19* (2013.01);
(Continued)

(58) Field of Classification Search
CPC ........ H02H 7/20; G05D 23/19; G11C 29/027; G11C 17/18
(Continued)

(56) References Cited

U.S. PATENT DOCUMENTS 3,991,357 A 11/1976 Kaminski
4,157,506 A 6/1979 Spencer
(Continued)

FOREIGN PATENT DOCUMENTS

CA 2818370 A1 * 5/2012 .......... F24F 11/0012
EP 207295 1/1987
(Continued)

OTHER PUBLICATIONS

Fairchild, Understanding Modern Power MOSFETS, Fairchild Power Seminar, 2006, p. 1-36, https://www.fairchildsemi.com.cn/Assets/zSystem/documents/collateral/onlineSeminars/Understanding-Modern-Power-MOSFETs-PPT.pdf.*
Adam, Using MOSFETS as General Switches, p. 1-7, no date, http://www.electronic-products-design.com/geek-area/electronics/MOSFETs/using-MOSFETs-as-general-switches.*
Fairchild, Understanding Modern Power MOSFETS, Fairchild Power Seminar, 2006, p. 1-36; https://www.fairchildsemi.com.cn/Assets/zSystem/documents/collateral/onlineSeminars/Understanding-Modern-Power-MOSFETs-PPT.pdf.*
U.S. Appl. No. 13/624,882, Non-Final Office Action dated Jun. 7, 2013, 9 pages.
U.S. Appl. No. 13/624,882, Notice of Allowance dated Oct. 10, 2013, 10 pages.
(Continued)

*Primary Examiner* — Jermele M Hollington
*Assistant Examiner* — Christopher McAndrew
(74) *Attorney, Agent, or Firm* — Kilpatrick Townsend & Stockton LLP

(57) ABSTRACT

A method of automated sensing of an electrical anomaly associated with a thermostat may include switching a switching circuit within the thermostat to an on state. The switching circuit may be configured to activate an HVAC function when switched to the on state. The method may also include monitoring one or more electrical properties associated with the switching circuit. The method may additionally include determining if an electrical anomaly is associated with the switching circuit based at least in part on the monitored one or more electrical properties. The method may further include switching the switching circuit to an off state if an electrical anomaly is detected.

11 Claims, 19 Drawing Sheets

(51) Int. Cl.
*G05D 23/19* (2006.01)
*F24D 19/10* (2006.01)
*G01R 31/07* (2006.01)
*H01H 85/02* (2006.01)
*H01H 85/32* (2006.01)
*F24D 5/02* (2006.01)
*F24D 5/12* (2006.01)

(52) U.S. Cl.
CPC ....... *G05D 23/1902* (2013.01); *H05B 1/0205* (2013.01); *F24D 5/02* (2013.01); *F24D 5/12* (2013.01); *G01R 31/07* (2013.01); *H01H 85/0241* (2013.01); *H01H 85/32* (2013.01); *H01H 2300/03* (2013.01); *Y02B 90/224* (2013.01); *Y04S 20/14* (2013.01)

(58) Field of Classification Search
USPC ...................................................... 324/550
See application file for complete search history.

(56) References Cited

U.S. PATENT DOCUMENTS

| | | |
|---|---|---|
| 4,308,991 A | 1/1982 | Peinetti et al. |
| 4,528,459 A | 7/1985 | Wiegel |
| 4,695,246 A | 9/1987 | Beilfuss et al. |
| 4,842,510 A | 6/1989 | Grunden et al. |
| 4,872,828 A | 10/1989 | Mierzwinski et al. |
| 4,898,229 A | 2/1990 | Brown et al. |
| 4,948,044 A | 8/1990 | Cacciatore |
| 4,955,806 A | 9/1990 | Grunden et al. |
| 5,107,918 A | 4/1992 | McFarlane et al. |
| 5,127,464 A | 7/1992 | Butler et al. |
| 5,158,477 A | 10/1992 | Testa et al. |
| 5,175,439 A | 12/1992 | Haerer et al. |
| 5,251,813 A | 10/1993 | Kniepkamp |
| 5,255,179 A | 10/1993 | Zekan et al. |
| 5,347,982 A | 9/1994 | Binzer et al. |
| 5,352,930 A | 10/1994 | Ratz |
| 5,381,950 A | 1/1995 | Aldridge |
| 5,422,808 A | 6/1995 | Catanese, Jr. et al. |
| 5,452,762 A | 9/1995 | Zillner, Jr. |
| 5,456,407 A | 10/1995 | Stalsberg et al. |
| 5,460,327 A | 10/1995 | Hill et al. |
| 5,462,225 A | 10/1995 | Massara et al. |
| 5,467,921 A * | 11/1995 | Shreeve ................ G05D 23/19 236/46 R |
| 5,506,569 A | 4/1996 | Rowlette |
| 5,570,837 A | 11/1996 | Brown et al. |
| 5,595,342 A | 1/1997 | McNair et al. |
| 5,611,484 A | 3/1997 | Uhrich |
| 5,635,896 A | 6/1997 | Tinsley et al. |
| 5,646,349 A | 7/1997 | Twigg et al. |
| 5,655,709 A | 8/1997 | Garnett et al. |
| 5,697,552 A | 12/1997 | McHugh et al. |
| 5,736,795 A | 4/1998 | Zuehlke et al. |
| 5,808,294 A | 9/1998 | Neumann |
| 5,903,139 A | 5/1999 | Kompelien |
| 5,918,474 A | 7/1999 | Khanpara et al. |
| 6,060,719 A | 5/2000 | DiTucci et al. |
| 6,072,784 A | 6/2000 | Agrawal et al. |
| 6,084,518 A | 7/2000 | Jamieson |
| 6,089,310 A | 7/2000 | Toth et al. |
| 6,213,404 B1 | 4/2001 | Dushane et al. |
| 6,222,719 B1 | 4/2001 | Kadah |
| 6,275,160 B1 | 8/2001 | Ha |
| 6,315,211 B1 | 11/2001 | Sartain et al. |
| 6,336,593 B1 | 1/2002 | Bhatnagar |
| 6,356,038 B2 | 3/2002 | Bishel |
| 6,509,838 B1 | 1/2003 | Payne et al. |
| 6,513,723 B1 | 2/2003 | Mueller et al. |
| 6,566,768 B2 | 5/2003 | Zimmerman et al. |
| 6,622,925 B2 | 9/2003 | Carner et al. |
| 6,623,311 B1 | 9/2003 | Dehan |
| 6,657,418 B2 | 12/2003 | Atherton |
| 6,743,010 B2 | 6/2004 | Bridgeman et al. |
| 6,794,771 B2 | 9/2004 | Orloff |
| 6,798,341 B1 | 9/2004 | Eckel et al. |
| 6,886,754 B2 | 5/2005 | Smith et al. |
| 6,956,463 B2 | 10/2005 | Crenella et al. |
| 7,174,239 B2 | 2/2007 | Butler et al. |
| 7,200,467 B2 | 4/2007 | Schanin et al. |
| 7,476,988 B2 | 1/2009 | Mulhouse et al. |
| 7,510,126 B2 | 3/2009 | Rossi et al. |
| 7,537,171 B2 | 5/2009 | Mueller et al. |
| 7,571,865 B2 | 8/2009 | Nicodem et al. |
| 7,648,077 B2 | 1/2010 | Rossi et al. |
| 7,673,809 B2 | 3/2010 | Juntunen |
| 7,748,640 B2 | 7/2010 | Roher et al. |
| 7,755,220 B2 | 7/2010 | Sorg et al. |
| 7,775,452 B2 | 8/2010 | Shah et al. |
| 7,841,542 B1 | 11/2010 | Rosen |
| 7,900,849 B2 | 3/2011 | Barton et al. |
| 8,091,375 B2 | 1/2012 | Crawford |
| 8,265,798 B2 | 9/2012 | Imes |
| 8,415,829 B2 | 4/2013 | Di Cristofaro |
| 8,659,302 B1 * | 2/2014 | Warren ................ G05D 23/19 324/550 |
| 2002/0063164 A1 * | 5/2002 | Stenzel ................ F23N 5/027 236/15 C |
| 2002/0074865 A1 | 6/2002 | Zimmerman et al. |
| 2003/0037555 A1 | 2/2003 | Street et al. |
| 2003/0064335 A1 | 4/2003 | Canon |
| 2003/0090243 A1 | 5/2003 | Atherton |
| 2003/0231001 A1 | 12/2003 | Bruning |
| 2004/0120084 A1 | 6/2004 | Readio et al. |
| 2004/0164238 A1 | 8/2004 | Xu et al. |
| 2004/0209209 A1 | 10/2004 | Chodacki et al. |
| 2004/0245349 A1 | 12/2004 | Smith |
| 2005/0024032 A1 * | 2/2005 | Yamamoto ........... B62D 5/0484 323/282 |
| 2005/0043907 A1 | 2/2005 | Eckel et al. |
| 2005/0145705 A1 | 7/2005 | Shah et al. |
| 2005/0270151 A1 | 12/2005 | Winick |
| 2006/0102731 A1 | 5/2006 | Mueller et al. |
| 2006/0124759 A1 | 6/2006 | Rossi et al. |
| 2006/0186214 A1 | 8/2006 | Simon et al. |
| 2007/0045432 A1 | 3/2007 | Juntunen |
| 2007/0095082 A1 | 5/2007 | Garrett et al. |
| 2007/0105252 A1 | 5/2007 | Lee et al. |
| 2007/0114848 A1 | 5/2007 | Mulhouse et al. |
| 2007/0131787 A1 | 6/2007 | Rossi et al. |
| 2007/0132503 A1 | 6/2007 | Nordin |
| 2007/0228183 A1 | 10/2007 | Kennedy et al. |
| 2007/0241203 A1 | 10/2007 | Wagner et al. |
| 2007/0241726 A1 * | 10/2007 | Parisi ................ G05F 1/66 323/234 |
| 2007/0296280 A1 | 12/2007 | Sorg et al. |
| 2008/0015742 A1 | 1/2008 | Kulyk et al. |
| 2008/0054082 A1 | 3/2008 | Evans et al. |
| 2008/0094010 A1 | 4/2008 | Black |
| 2008/0133956 A1 | 6/2008 | Fadell |
| 2008/0147242 A1 | 6/2008 | Roher et al. |
| 2009/0099697 A1 | 4/2009 | Li et al. |
| 2009/0140057 A1 | 6/2009 | Leen |
| 2009/0194601 A1 | 8/2009 | Flohr |
| 2009/0231892 A1 * | 9/2009 | Klikic ................ H02J 9/062 363/56.1 |
| 2009/0236433 A1 | 9/2009 | Mueller et al. |
| 2009/0259713 A1 | 10/2009 | Blumrich et al. |
| 2010/0006660 A1 | 1/2010 | Leen et al. |
| 2010/0070099 A1 | 3/2010 | Watson et al. |
| 2010/0084482 A1 | 4/2010 | Kennedy et al. |
| 2010/0084918 A1 | 4/2010 | Fells et al. |
| 2010/0182743 A1 | 7/2010 | Roher |
| 2010/0193592 A1 | 8/2010 | Simon et al. |
| 2011/0025257 A1 | 2/2011 | Weng |
| 2011/0152024 A1 | 6/2011 | Kuehl |
| 2011/0253796 A1 | 10/2011 | Posa et al. |
| 2012/0017611 A1 | 1/2012 | Coffel et al. |
| 2012/0125559 A1 * | 5/2012 | Fadell ................ F24F 11/0012 165/11.2 |

(56) References Cited

U.S. PATENT DOCUMENTS

| | | | | |
|---|---|---|---|---|
| 2012/0130679 A1* | 5/2012 | Fadell | ................. | F24F 11/0012 |
| | | | | 702/183 |
| 2012/0239221 A1* | 9/2012 | Mighdoll | ............. | F24F 11/0012 |
| | | | | 700/300 |
| 2012/0248211 A1 | 10/2012 | Warren et al. | | |

FOREIGN PATENT DOCUMENTS

| | | |
|---|---|---|
| EP | 510807 | 10/1992 |
| EP | 660287 | 6/1995 |
| EP | 690363 | 1/1996 |
| EP | 2302326 | 3/2011 |
| GB | 2294828 | 5/1996 |
| JP | 09298780 | 11/1997 |
| WO | 2008054938 | 5/2008 |

OTHER PUBLICATIONS

U.S. Appl. No. 13/624,882, Restriction Requirement dated Jan. 7, 2013, 6 pages.

Alam et al., A review of smart homes—past, present and future, IEEE Trans. on Systems, Man, and Cybernetics, Part C, vol. 42, No. 6, 2012, pp. 1190-1203.

Detroitborg, Nest Learning Thermostat: Unboxing and Review, [online], retrieved from the Internet: <URL: http://www.youtube.com/watch?v=KrgcOL4oLzc> [retrieved on Aug. 22, 2013], Feb. 10, 2012, 4 pages.

* cited by examiner

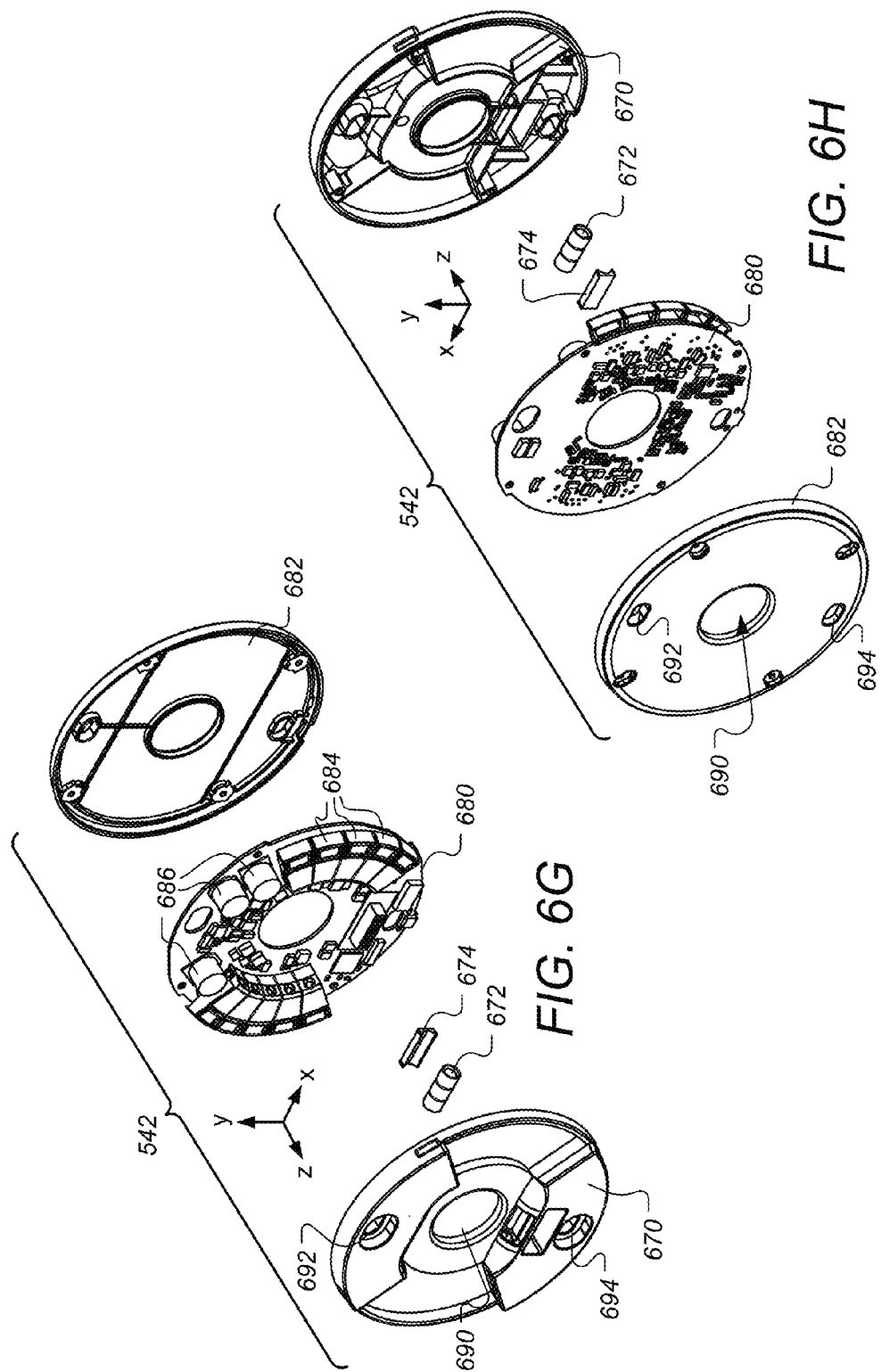

MONITORING AND RECOVERABLE PROTECTION OF THERMOSTAT SWITCHING CIRCUITRY

CROSS-REFERENCES TO RELATED APPLICATIONS

This application claims the benefit of and is a divisional of U.S. patent application Ser. No. 13/624,882 filed Sep. 21, 2012, which is incorporated herein by reference in its entirety for all purposes.

FIELD

This patent specification relates to systems, methods, and related computer program products for the monitoring and control of energy-consuming systems or other resource-consuming systems. More particularly, this patent specification relates to monitoring and recoverable protection of thermostat circuitry.

BACKGROUND

During the installation or subsequent upgrade of an HVAC system, there are occasions when wires may be incorrectly connected to various components of the HVAC system, including an electronic thermostat. When wires are incorrectly connected to a thermostat, there is the possibility for a short circuit to be created that if not accounted for could result in permanent damage to either the thermostat, the HVAC wiring and/or other HVAC system components. In order to protect against such conditions, the electronic thermostat can include one or more fuses that are designed to blow under the increased current of a short circuit condition. However, blown fuses are problematic from support and customer satisfaction viewpoint. The problem of blown fuses can be particularly problematic for thermostats that are intended to be user-installable. A non-expert installer, such as a user, is somewhat more likely to incorrectly connect wires, and additionally they may be less able to correctly diagnose and correct the error.

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

SUMMARY

According to one or more embodiments, a method is described for automated monitoring of a protection fuse within a thermostat. The method includes measuring electrical properties, such as voltage, associated with first and second terminals of the protection fuse. The protection fuse is connected to an HVAC function control circuit configured to turn on and off an HVAC function such that the protection fuse blows when the HVAC function control circuit experiences excessive current. A microprocessor within the thermostat is used to automatically detect whether the fuse is in a blown state based on the measured electrical properties. In cases where the microprocessor detects the fuse in a blown state, data is written to a memory indicating the detected blown state of the fuse.

According to some embodiments, in cases where the microprocessor detects the fuse in a blown state: (1) an error message is displayed on a display of the thermostat indicating that the fuse is blown; (2) a message is transmitted to a user indicating that the fuse is blown (for example via a web application for viewing by a user on a personal computer, or via a mobile application for viewing on a smart phone); and/or (3) information is transmitted to a manufacturer of the thermostat indicating that the fuse is blown. According to some embodiments, the information transmitted to the manufacturer includes diagnostic information which facilitates a diagnosis performed by the manufacturer, and an offer by the manufacturer for expert assistance to the user of the thermostat.

According to some embodiments, a method is described for automated sensing of an anomalous wiring condition (such as excessive current) associated with a thermostat. The method includes: switching on a field effect transistor within the thermostat, the field effect transistor and associated circuitry configured to turn on an HVAC function; monitoring one or more electrical properties associated with the field effect transistor (such as drain voltage); determining if an anomalous wiring condition is associated with the field effect transistor based at least in part on the monitored one or more electrical properties; and switching off the field effect transistor if it is determined that an anomalous wiring condition is associated with the field effect transistor. According to some embodiments, once a determining is made that the anomalous wiring condition has been corrected, the field effect transistor is switched back on. According to some embodiments, messaging to the user and manufacturer can also be provided. According to some embodiments messages and/or information can be transmitted to a user and/or a manufacturer as described above.

It will be appreciated that these systems and methods are novel, as are applications thereof and many of the components, systems, methods and algorithms employed and included therein. It should be appreciated that embodiments of the presently described inventive body of work can be implemented in numerous ways, including as processes, apparata, systems, devices, methods, computer readable media, computational algorithms, embedded or distributed software and/or as a combination thereof. Several illustrative embodiments are described below.

BRIEF DESCRIPTION OF THE DRAWINGS

The inventive body of work will be readily understood by referring to the following detailed description in conjunction with the accompanying drawings, in which:

FIGS. 6G-6H illustrate exploded front and rear perspective views, respectively, of a back plate unit with respect to its primary components, according to some embodiments;

DETAILED DESCRIPTION

Figure 1:
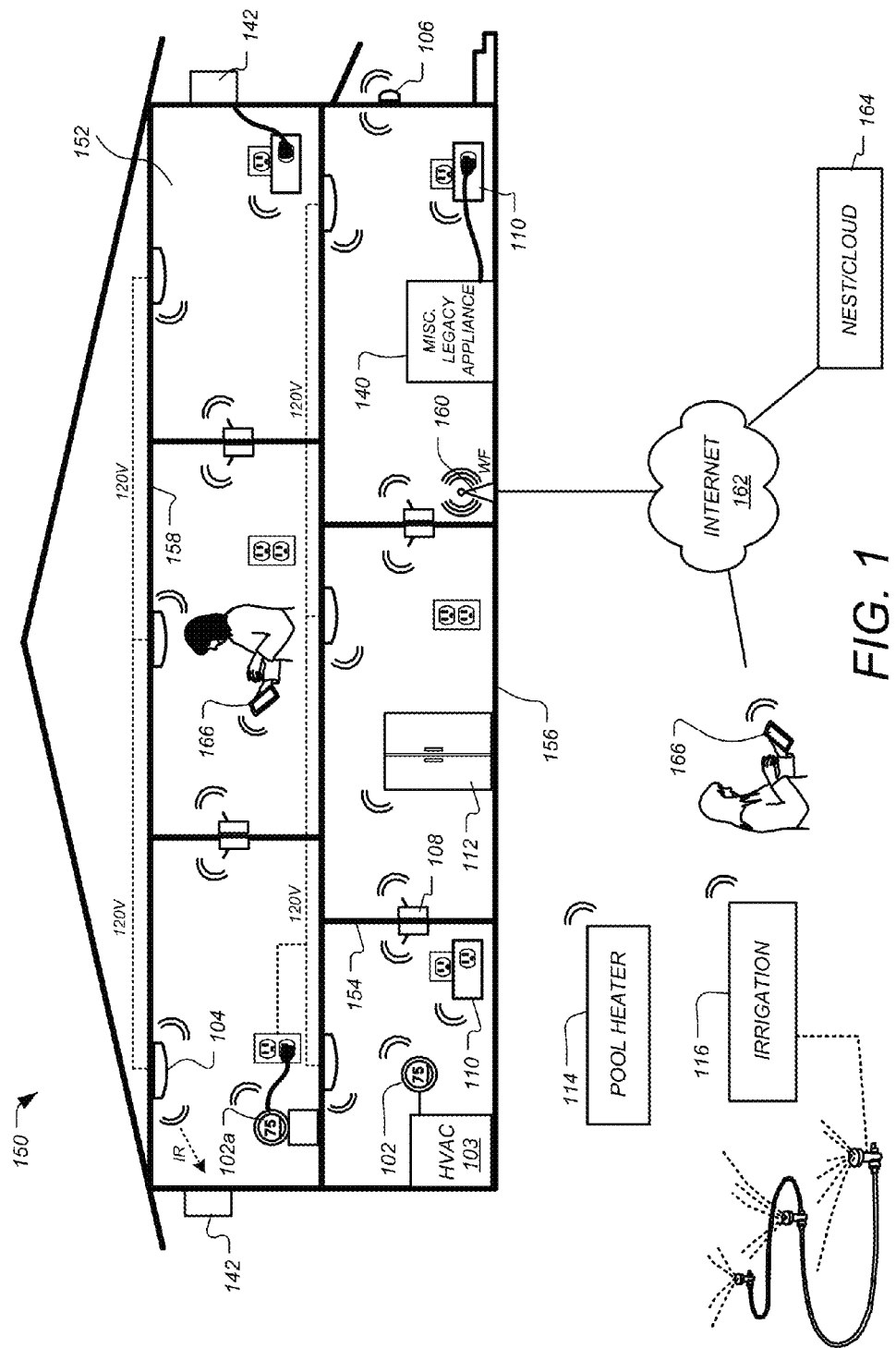
FIG. 1 illustrates an example of a smart home environment within which one or more of the devices, methods, systems, services, and/or computer program products described further herein can be applicable.

The subject matter of this patent specification relates to the subject matter of the following commonly assigned applications, each of which is incorporated by reference herein: U.S. Ser. No. 13/034,674 filed Feb. 24, 2011; U.S. Ser. No. 13/034,678 filed Feb. 24, 2011; U.S. Ser. No. 13/034,666 filed Feb. 24, 2011; U.S. Ser. No. 13/467,029 filed May 8, 2012; and International Application Ser. No. PCT/US12/00007 filed Jan. 3, 2012. The above-referenced patent applications are collectively referenced herein as "the commonly assigned incorporated applications."

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
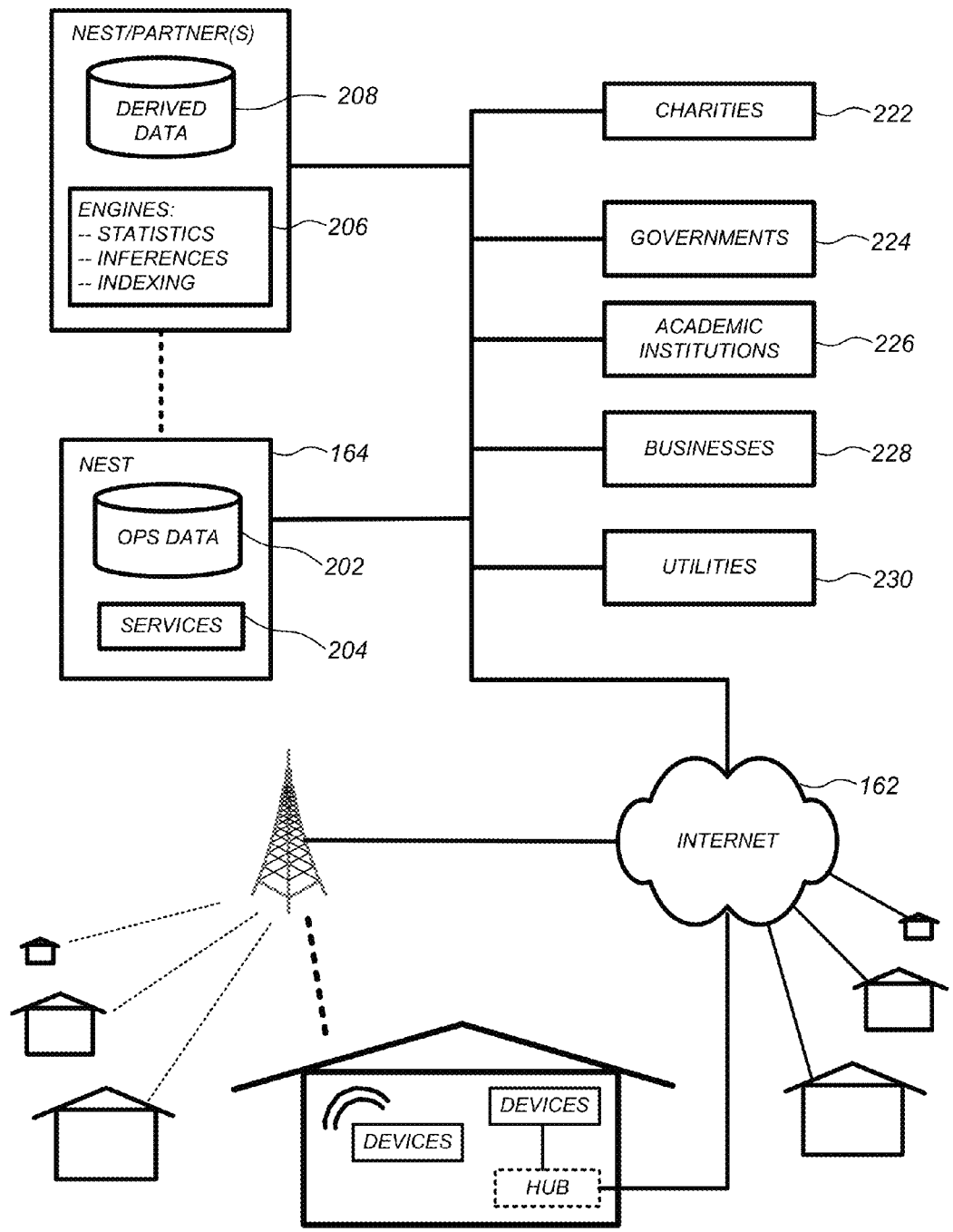
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
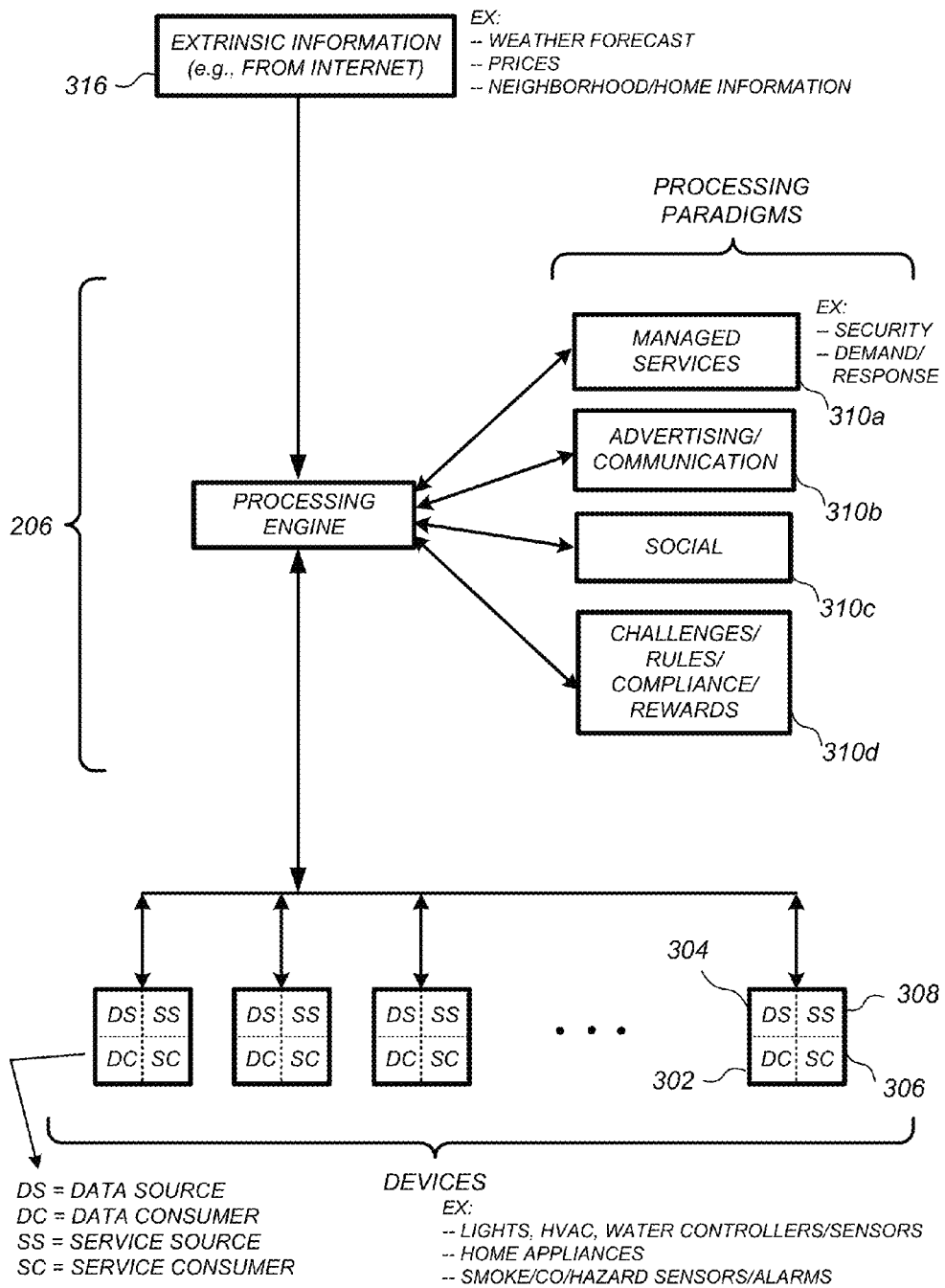
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
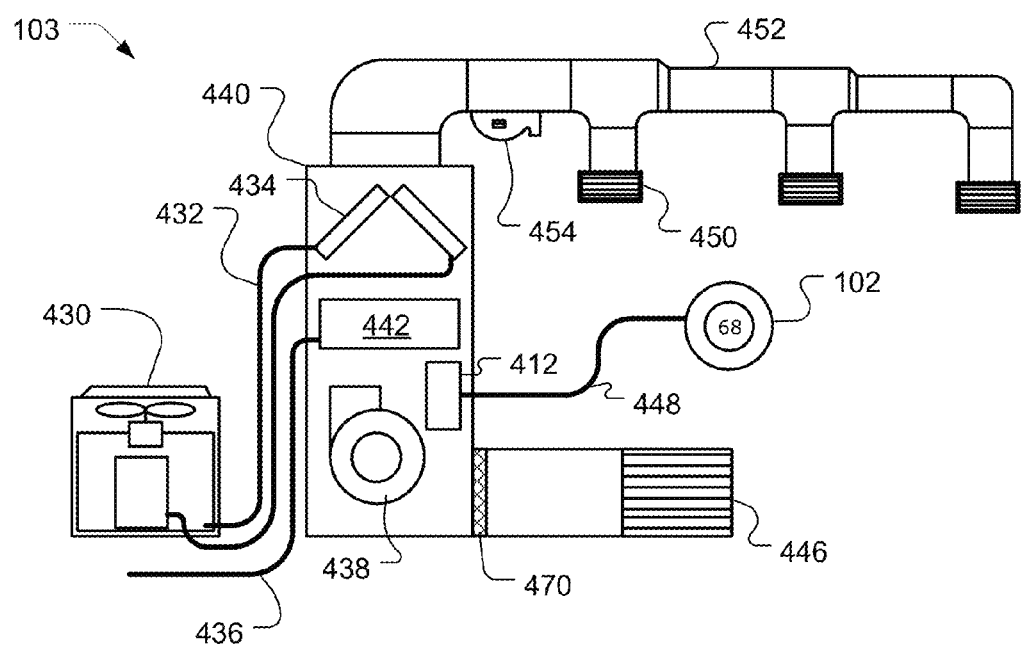
FIG. 4 is a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a refrigerant gas through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

Figure 5A:
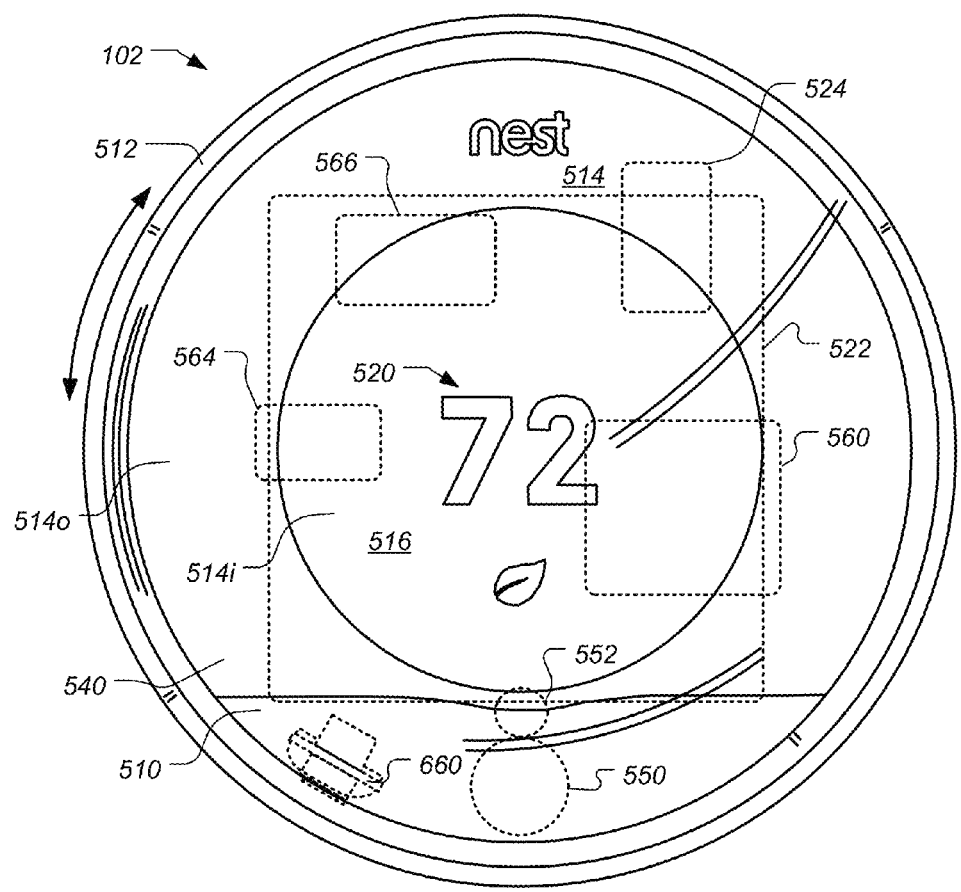
FIGS. 5A-5D illustrate a thermostat having a visually pleasing, smooth, sleek and rounded exterior appearance while at the same time including one or more sensors for detecting occupancy and/or users, according to some embodiments.
Figure 5B:
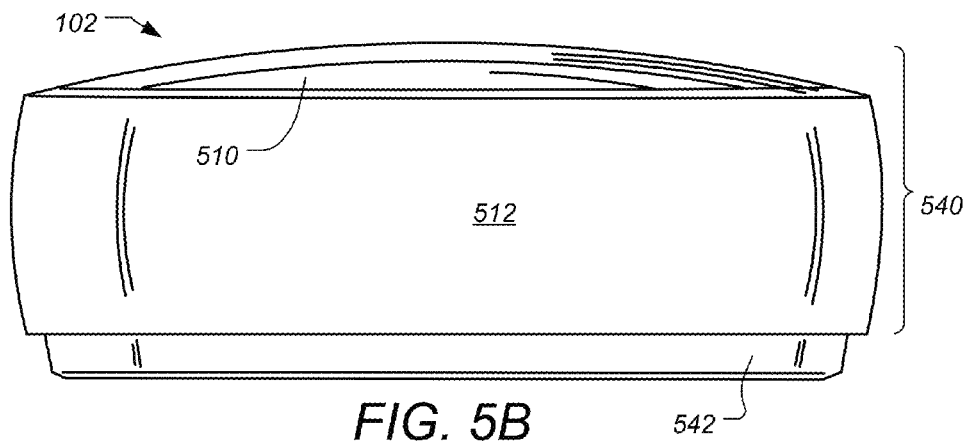
Figure 5C:
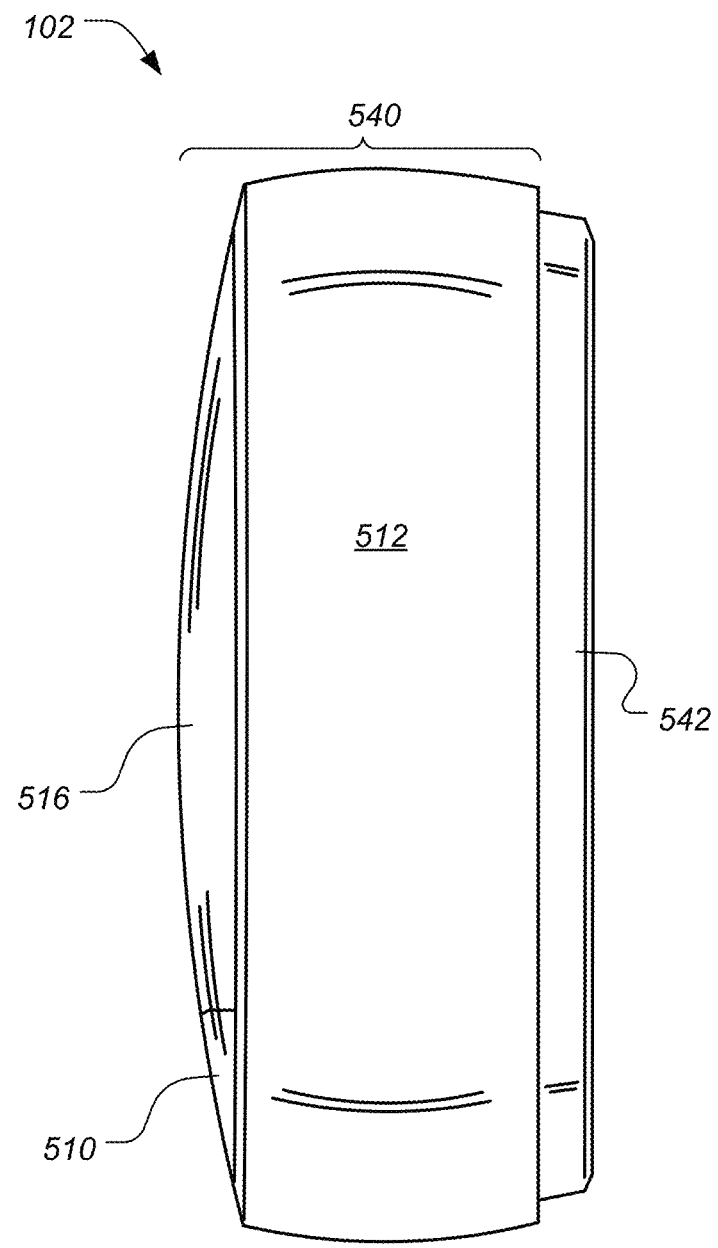
Figure 5D:
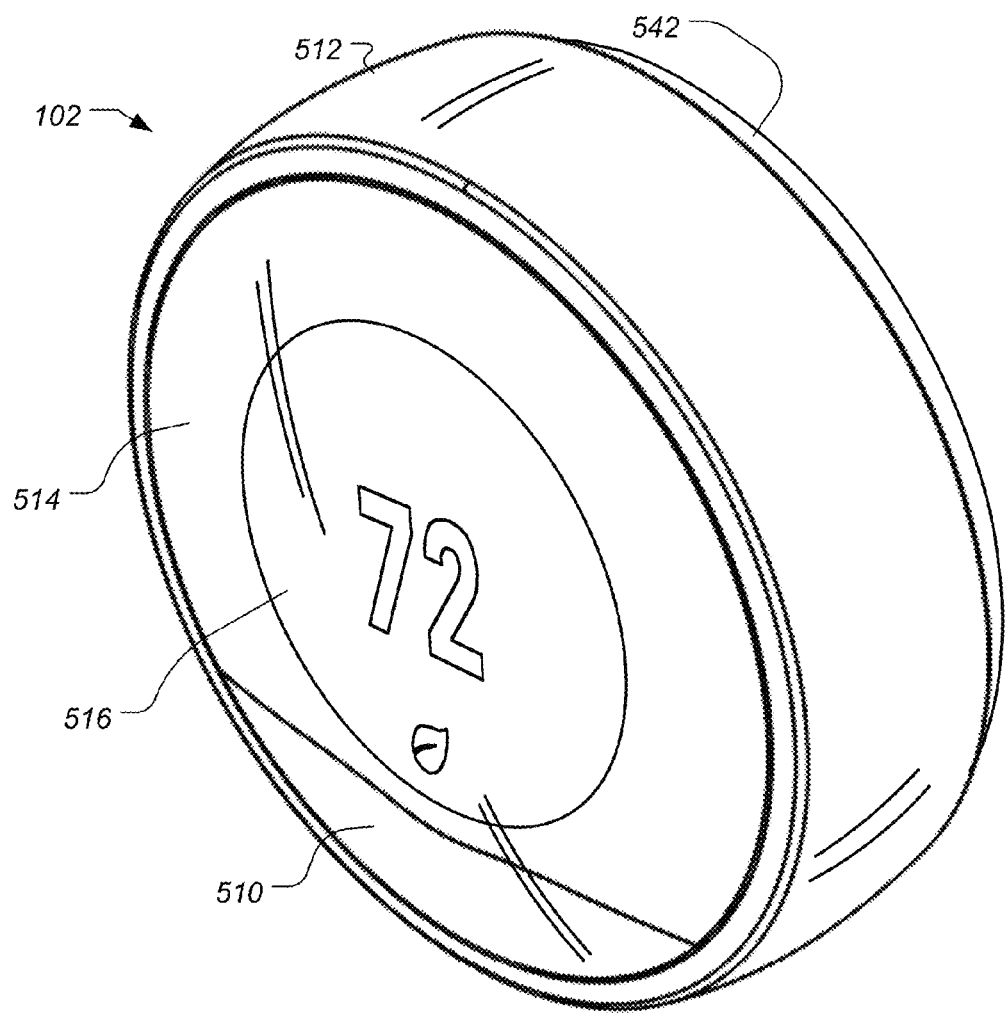

FIGS. 5A-5D illustrate a thermostat having a visually pleasing, smooth, sleek and rounded exterior appearance while at the same time including one or more sensors for detecting occupancy and/or users, according to some embodiments. FIG. 5A is front view, FIG. 5B is a bottom elevation, FIG. 5C is a right side elevation, and FIG. 5D is prospective view of thermostat 102. Unlike many prior art thermostats, thermostat 102 has a sleek, simple, uncluttered and elegant design that does not detract from home decoration, and indeed can serve as a visually pleasing centerpiece for the immediate location in which it is installed. Moreover, user interaction with thermostat 102 is facilitated and greatly enhanced over known conventional thermostats by the design of thermostat 102. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 is circular in shape in that it appears as a generally disk-like circular object when mounted on the wall. Thermostat 102 has a large convex rounded front face lying inside the outer ring 512. According to some embodiments, thermostat 102 is approximately 80 mm in diameter and protrudes from the wall, when wall mounted, by 32 mm. The outer rotatable ring 512 allows the user to make adjustments, such as selecting a new setpoint temperature. For example, by rotating the outer ring 512 clockwise, the realtime (i.e. currently active) setpoint temperature can be increased, and by rotating the outer ring 512 counter-clockwise, the realtime setpoint temperature can be decreased. The front face of the thermostat 102 comprises a clear cover 514 that according to some embodiments is polycarbonate, and a Fresnel lens 510 having an outer shape that matches the contours of the curved outer front face of the thermostat 102. According to some embodiments, the Fresnel lens elements are formed on the interior surface of the Fresnel lens piece 510 such that they are not obviously visible by viewing the exterior of the thermostat 102. Behind the Fresnel lens is a passive infrared sensor 550 for detecting occupancy, and the Fresnel lens piece 510 is made from a high-density polyethylene (HDPE) that has an infrared transmission range appropriate for sensitivity to human bodies. As shown in FIGS. 5A-5D, the front edge of rotating ring 512, front face 514 and Fresnel lens 510 are shaped such that they together form a, integrated convex rounded front face that has a common outward arc or spherical shape gently arcing outward.

Although being formed from a single lens-like piece of material such as polycarbonate, the cover 514 has two different regions or portions including an outer portion 514o and a central portion 514i. According to some embodiments, the cover 514 is painted or smoked around the outer portion 514o, but leaves the central portion 514i visibly clear so as to facilitate viewing of an electronic display 516 disposed thereunderneath. According to some embodiments, the curved cover 514 acts as a lens that tends to magnify the information being displayed in electronic display 516 to users. According to some embodiments the central electronic display 516 is a dot-matrix layout (i.e. individually addressable) such that arbitrary shapes can be generated, rather than being a segmented layout. According to some embodiments, a combination of dot-matrix layout and segmented layout is employed. According to some embodiments, central display 516 is a backlit color liquid crystal display (LCD). An example of information displayed on the electronic display 516 is illustrated in FIG. 5A, and includes central numerals 520 that are representative of a current setpoint temperature. The thermostat 102 is preferably constructed such that the electronic display 516 is at a fixed orientation and does not rotate with the outer ring 512, so that the electronic display 516 remains easily read by the user. For some embodiments, the cover 514 and Fresnel lens 510 also remain at a fixed orientation and do not rotate with the outer ring 512. According to one embodiment in which the diameter of the thermostat 102 is about 80 mm, the diameter of the electronic display 516 is about 45 mm. According to some embodiments the gently outwardly curved shape of the front surface of thermostat 102, which is made up of cover 514, Fresnel lens 510 and the front facing portion of ring 512, is spherical, and matches a sphere having a radius of between 100 mm and 150 mm. According to some embodiments, the radius of the spherical shape of the thermostat front is about 136 mm.

Motion sensing with PIR sensor 550 as well as other techniques can be used in the detection and/or predict of occupancy, as is described further in the commonly assigned U.S. Ser. No. 12/881,430, which is incorporated herein by reference. According to some embodiments, occupancy information is used in generating an effective and efficient scheduled program. A second downwardly-tilted PIR sensor 552 is provided to detect an approaching user. The proximity sensor 552 can be used to detect proximity in the range of about one meter so that the thermostat 102 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, for the combined purposes of inspiring user confidence and further promoting visual and functional elegance, the thermostat 102 is controlled by only two types of user input, the first being a rotation of the outer ring 512 as shown in FIG. 5A (referenced hereafter as a "rotate ring" or "ring rotation" input), and the second being an inward push on head unit 540 until an audible and/or tactile "click" occurs (referenced hereafter as an "inward click" or simply "click" input). For such embodiments, the head unit 540 is an assembly that includes all of the outer ring 512, cover 514, electronic display 516, and the Fresnel lens 510. When pressed inwardly by the user, the head unit 540 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 5A-5D, an inward click can be achieved by direct pressing on the outer ring 512 itself, or by indirect pressing of the outer ring by virtue of providing inward pressure on the cover 514, lens 510, or by various combinations thereof. For other embodiments, the thermostat 102 can be mechanically configured such that only the outer ring 512 travels inwardly for the inward click input, while the cover 514 and lens 510 remain motionless. It is to be appreciated that a variety of different selections and combinations of the particular mechanical elements that will travel inwardly to achieve the "inward click" input are within the scope of the present teachings, whether it be the outer ring 512 itself, some part of the cover 514, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 512 has been found particularly advantageous, since the user's fingers do not need to be lifted out of contact with the device, or slid along its surface, in order to go between ring rotations and inward clicks. Moreover, by virtue of the strategic placement of the electronic display 516 centrally inside the rotatable ring 512, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. No. 13/033,573, U.S. Ser. No. 29/386,021, and U.S. Ser. No. 13/199,108, all of which are incorporated herein by reference.

FIGS. 5B and 5C are bottom and right side elevation views of the thermostat 102, which has been found to provide a particularly pleasing and adaptable visual appearance when viewed against a variety of different wall colors and wall textures in a variety of different home environments and home settings. While the thermostat itself will functionally adapt to the user's schedule as described herein and in one or more of the commonly assigned incorporated applications, supra, the outer shape is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles.

According to some embodiments, the thermostat 102 includes a processing system 560, display driver 564 and a wireless communications system 566. The processing system 560 is adapted to cause the display driver 564 and display 516 to display information to the user, and to receiver user input via the rotatable ring 512. The processing system 560, according to some embodiments, is capable of carrying out the governance of the operation of thermostat 102 including various user interface features. The processing system 560 is further programmed and configured to carry out other operations as described further hereinbelow and/or in other ones of the commonly assigned incorporated applications. For example, processing system 560 is further programmed and configured to maintain and update a thermodynamic model for the enclosure in which the HVAC system is installed, such as described in U.S. Ser. No. 12/881,463, and in International Patent App. No. PCT/US11/51579, both of which are incorporated herein by reference. According to some embodiments, the wireless communications system 566 is used to communicate with devices such as personal computers and/or other thermostats or HVAC system components, which can be peer-to-peer communications, communications through one or more servers located on a private network, or and/or communications through a cloud-based service.

According to some embodiments, for ease of installation, configuration and/or upgrading, especially by a non-expert installer such as a user, the thermostat 102 includes a head unit 540 and a backplate (or wall dock) 542. As is described hereinabove, thermostat 102 is wall mounted and has circular in shape and has an outer rotatable ring 512 for receiving user input. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit(s) or from a common wire, if available, as described in further detail in co-pending patent application U.S. Ser. Nos. 13/034,674, and 13/034,678, which are incorporated by reference herein. According to some embodiments, rechargeable battery 522 is a single cell lithium-ion, or a lithium-polymer battery.

Figure 6A:
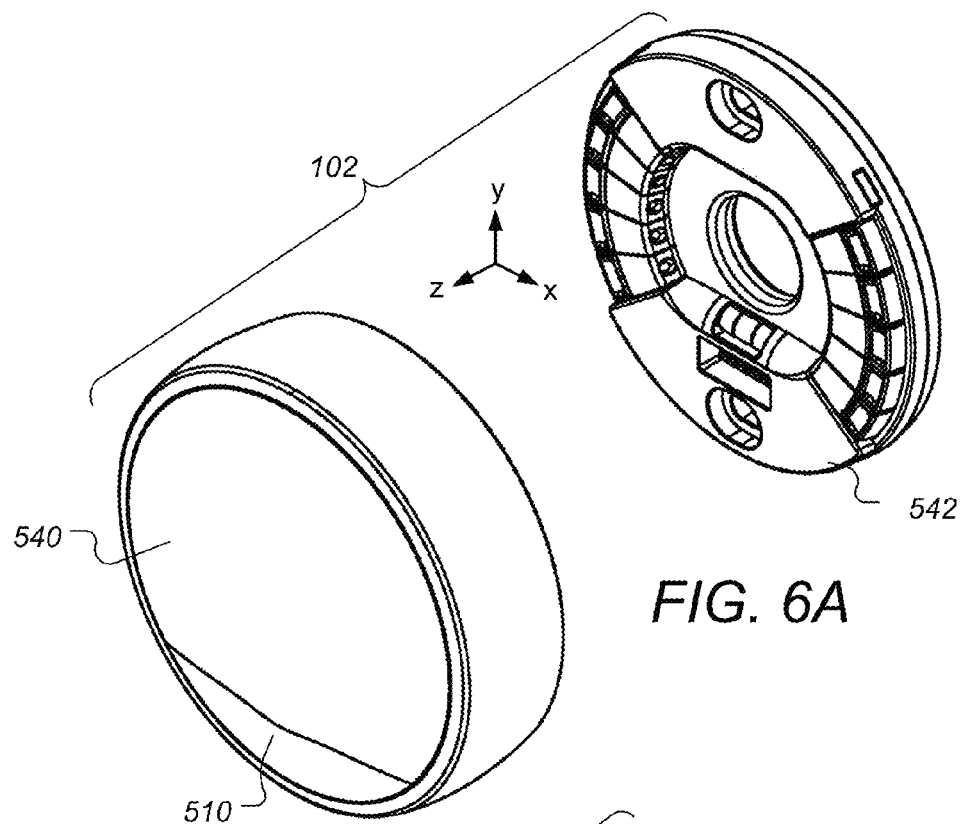
FIGS. 6A-6B illustrate exploded front and rear perspective views, respectively, of a thermostat with respect to its two main components, according to some embodiments.
Figure 6B:
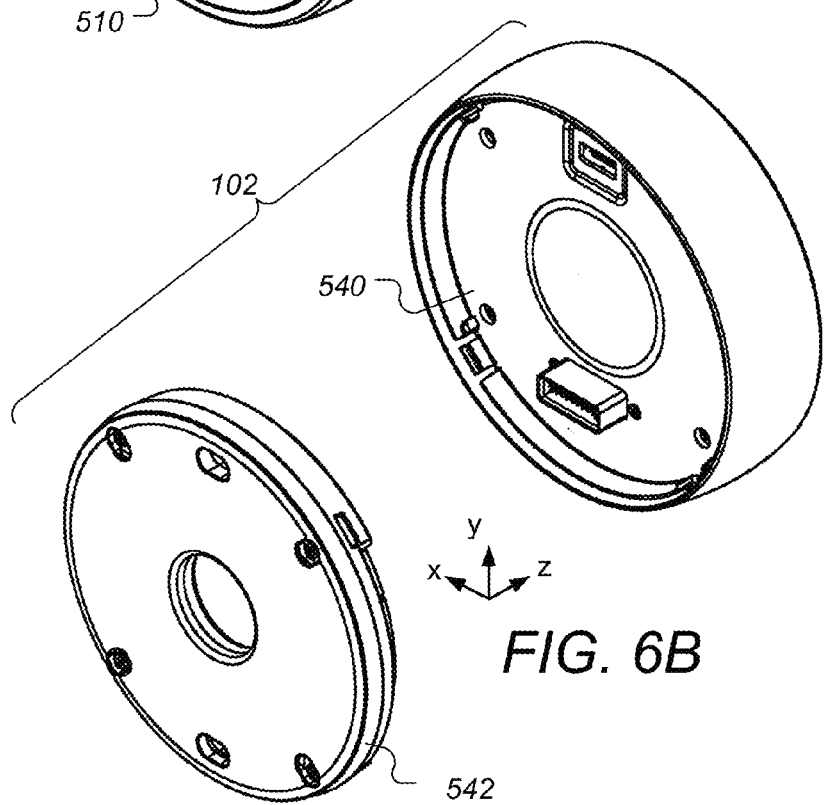

FIGS. 6A-6B illustrate exploded front and rear perspective views, respectively, of the thermostat 102 with respect to its two main components, which are the head unit 540 and the backplate 542. Further technical and/or functional descriptions of various ones of the electrical and mechanical components illustrated hereinbelow can be found in one or more of the commonly assigned applications, such as U.S. Ser. No. 13/199,108, incorporated herein by reference. In the drawings shown herein, the "z" direction is outward from the wall, the "y" direction is the toe-to-head direction relative to a walk-up user, and the "x" direction is the user's left-to-right direction.

Figure 6C:
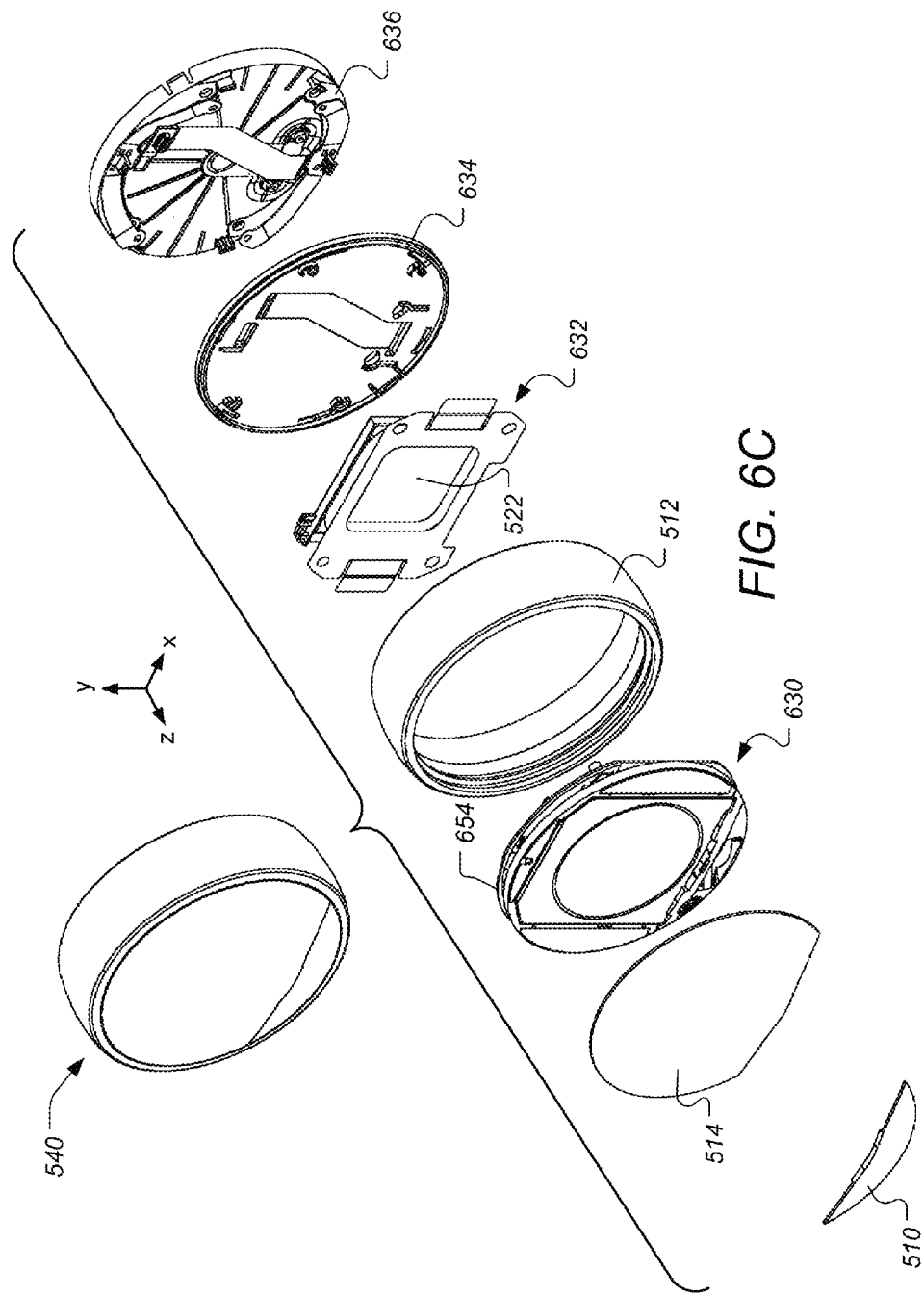
FIGS. 6C-6D illustrate exploded front and rear perspective views, respectively, of a head unit with respect to its primary components, according to some embodiments.
Figure 6D:
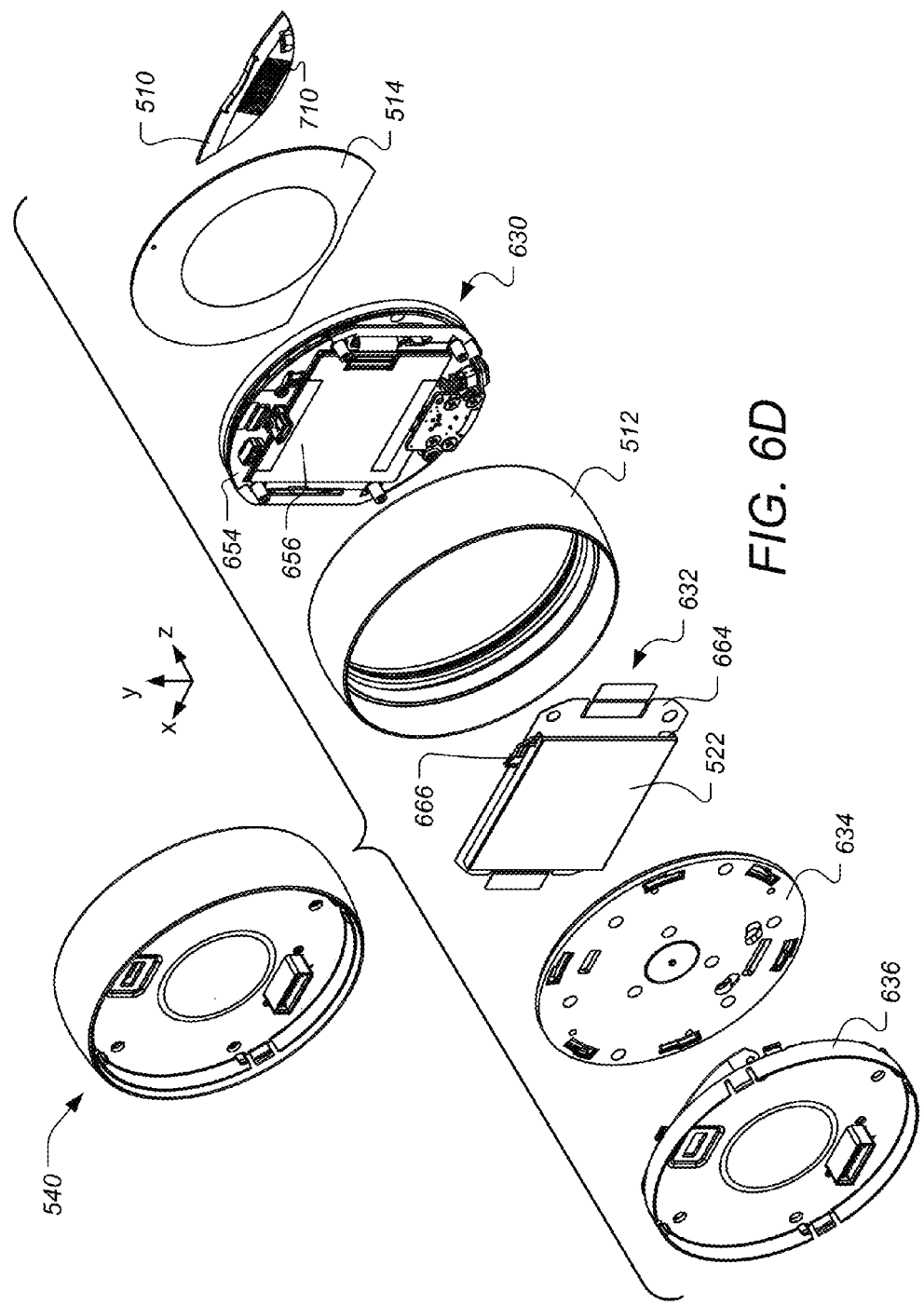

FIGS. 6C-6D illustrate exploded front and rear perspective views, respectively, of the head unit 540 with respect to its primary components. Head unit 540 includes, back cover 636, bottom frame 634, battery assembly 632, the outer ring 512 (which is manipulated for ring rotations), head unit frontal assembly 630, front lens 514, and Fresnel lens 510. Electrical components on the head unit frontal assembly 630 can connect to electrical components on the back plate 542 by virtue of ribbon cables and/or other plug type electrical connectors on back cover 636. Head unit frontal assembly 630 is secured to head unit back cover 636 and bottom frame 634 via four bosses. The outer ring 512 is thereby held between a bearing surface on the head unit top frame 652 (shown in FIGS. 6E and 6F, infra) and bearing surfaces on the bottom frame 634. In particular motion of the ring 512 in z direction is constrained by flat bearing surfaces on the top frame 652 and bottom frame 634, while motion of the ring in x and y directions are constrained by circular rounded surfaces on the bottom frame 634. According to some embodiments, the bearing surfaces of the bottom frame 634 and/or the top frame 652 are greased and/or otherwise lubricated to both smooth and dampen rotational movement for ring 512. Attached to top frame 652 is the head unit printed circuit board (PCB) 654 on which much of the head unit circuitry is mounted including some or all of processing system 560, display driver 564, wireless communication system 566 and battery recharging circuitry 524 as shown and described with respect to FIG. 5A, as well as one or more additional memory storage components. According to some embodiments, circuitry and components are mounted on both sides of PCB 654. A shielding can 656 (visible in FIG. 6D) surrounds most or all of the head unit circuitry and components on PCB 654 and serves to shield the circuitry and components from electromagnetic interference. Although not visible, according to some embodiments, shielding can 656 surrounds circuitry and components on both sides of PCB 654.

Battery assembly 632 includes a rechargeable Lithium-Ion battery 522, which for one preferred embodiment has a nominal voltage of 3.7 volts and a nominal capacity of 560 mAh. To extend battery life, however, the battery 522 is normally not charged beyond 450 mAh by the thermostat battery charging circuitry. Moreover, although the battery 522 is rated to be capable of being charged to 4.2 volts, the thermostat battery charging circuitry normally does not charge it beyond 3.95 volts. Battery assembly 632 also includes connecting wires 666, and a battery mounting film 664 that is attached to battery 522 using a strong adhesive and to the rear shielding can 656 of head unit PCB 654 using a relatively weaker adhesive. By using a weaker adhesive to mount the film 664 of battery assembly 632 to shielding can 656 of the PCB 654, subsequent replacement of battery assembly 632 (including battery 522) is facilitated. According to some embodiments, the battery assembly 632 is user-replaceable.

Figure 6E:
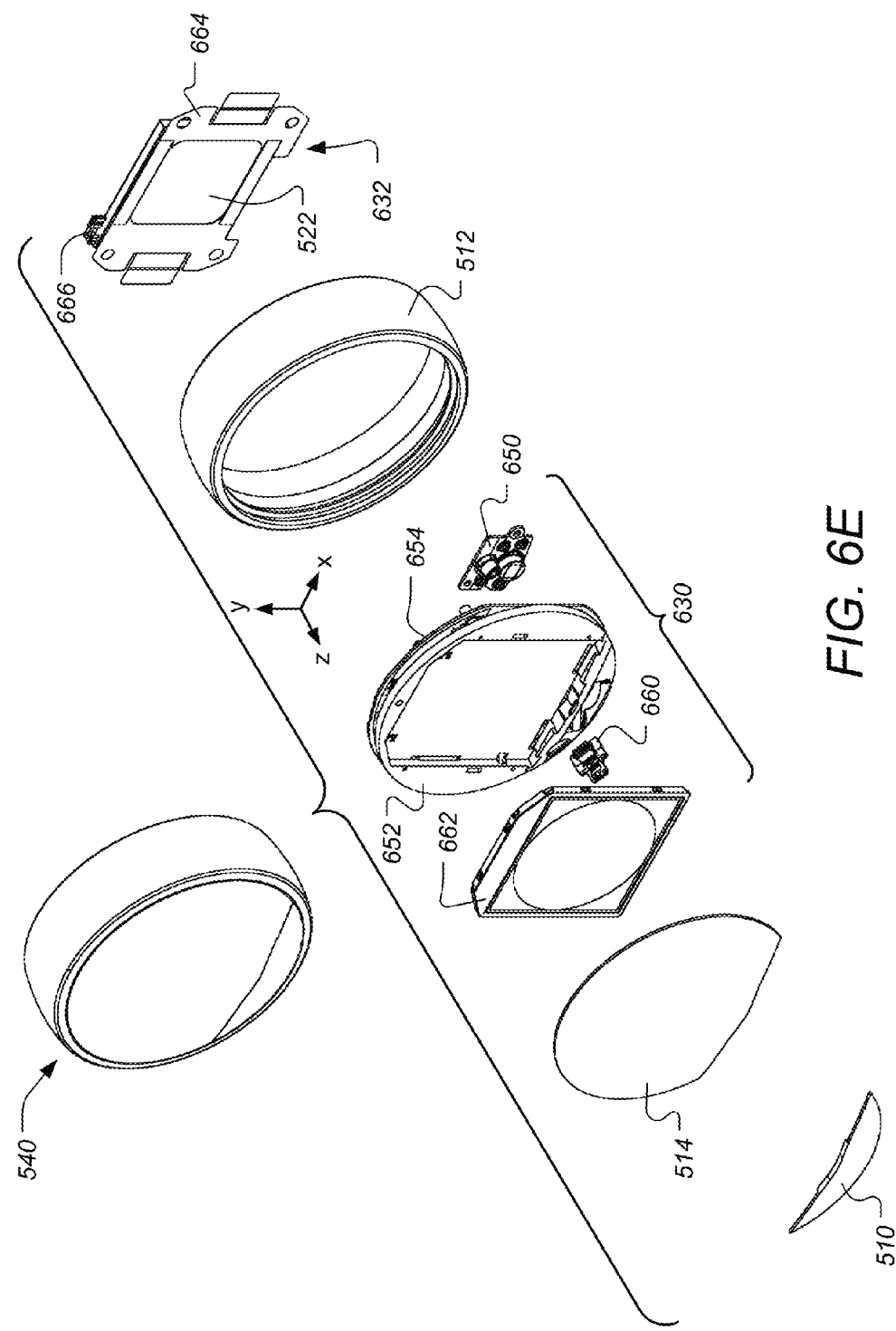
FIGS. 6E-6F illustrate exploded front and rear perspective views, respectively, of a head unit frontal assembly with respect to its primary components, according to some embodiments.
Figure 6F:
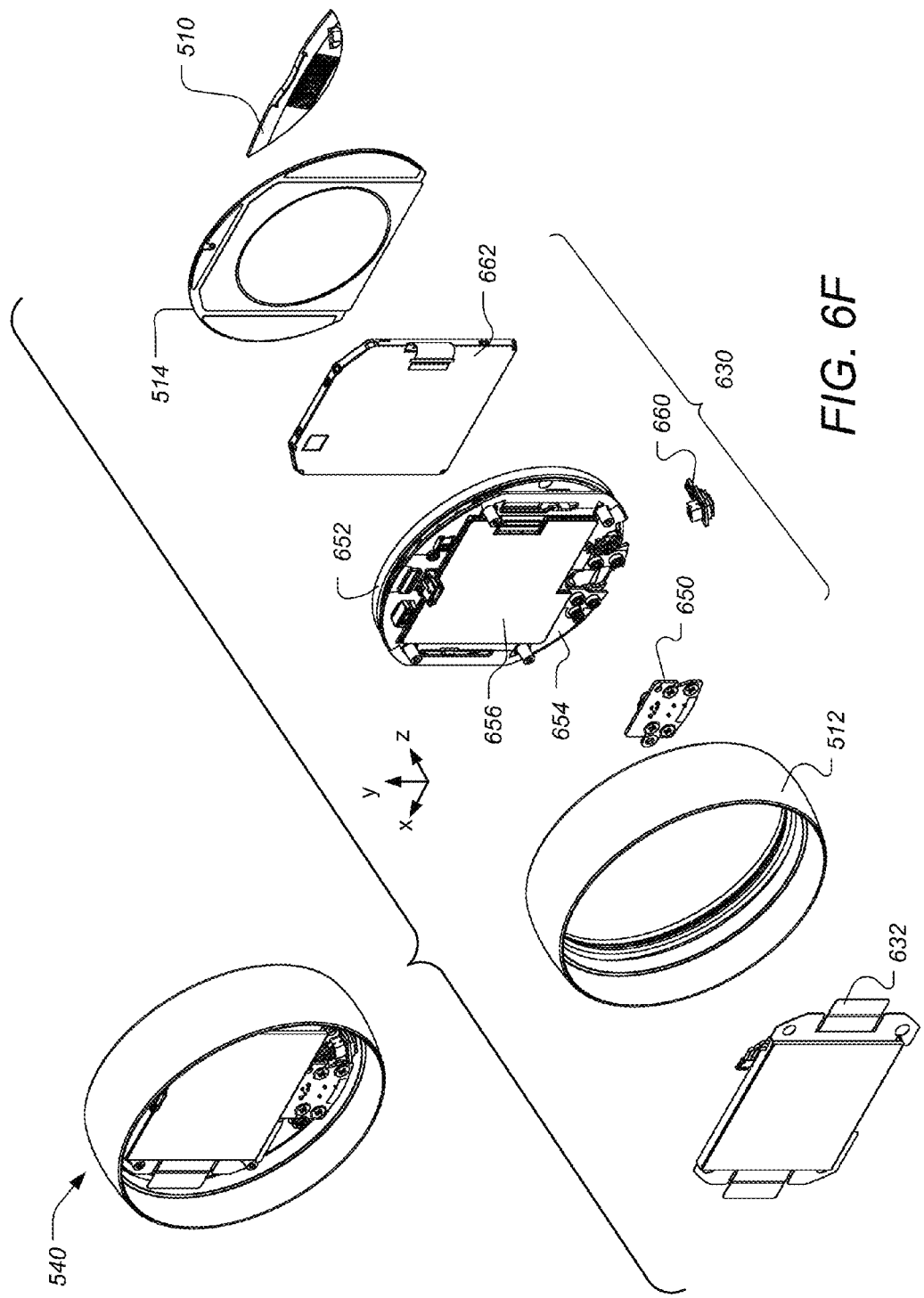

FIGS. 6E-6F illustrate exploded front and rear perspective views, respectively, of the head unit frontal assembly 630 with respect to its primary components. Head unit frontal assembly 630 comprises a head unit top frame 652, head unit PCB 654, and LCD module 662. Daughter board 660 connects to the head unit PCB 654 and includes an optical finger navigation (OFN) module that is configured and positioned to sense rotation of the outer ring 512. The OFN module is directed radially outwardly (that is, perpendicular to the z-axis and away from the center of the thermostat). The OFN module uses methods analogous to the operation of optical computer mice to sense the movement of a textured surface on an inner face of the outer ring 512. Notably, the OFN module is one of the very few sensors that is controlled by the relatively power-intensive head unit microprocessor rather than the relatively low-power back plate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIGS. 6E and 6F is Fresnel lens 510 that operates in conjunction with two PIR motion sensors mounted on PIR board 650. Two or more temperature sensors are also located in the head unit 540 and cooperate to acquire reliable and accurate room temperature data. One of the temperature sensors is located on daughter board 660 and the other is mounted on the head unit PCB 654.

FIGS. 6G-6H illustrate exploded front and rear perspective views, respectively, of the back plate unit 542 with respect to its primary components, according to some embodiments. Back plate unit 542 comprises a back plate rear plate 682, a back plate circuit board 680, and a back plate cover 670. Visible in FIG. 6G are the HVAC wire connectors 684 that include integrated mechanical wire insertion sensing circuitry, and relatively large capacitors 686 that are used by part of the power stealing circuitry that is mounted on the back plate circuit board 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. The single top wall-mounting hole 692 on backplate has been found to allow for self-leveling during installation, thereby further enhancing the ease of a non-expert installation of the thermostat 102. Also visible in FIGS. 6G and 6H are bubble level 672 and holder 674 for further facilitating user-installability of the thermostat 102.

Figure 7:
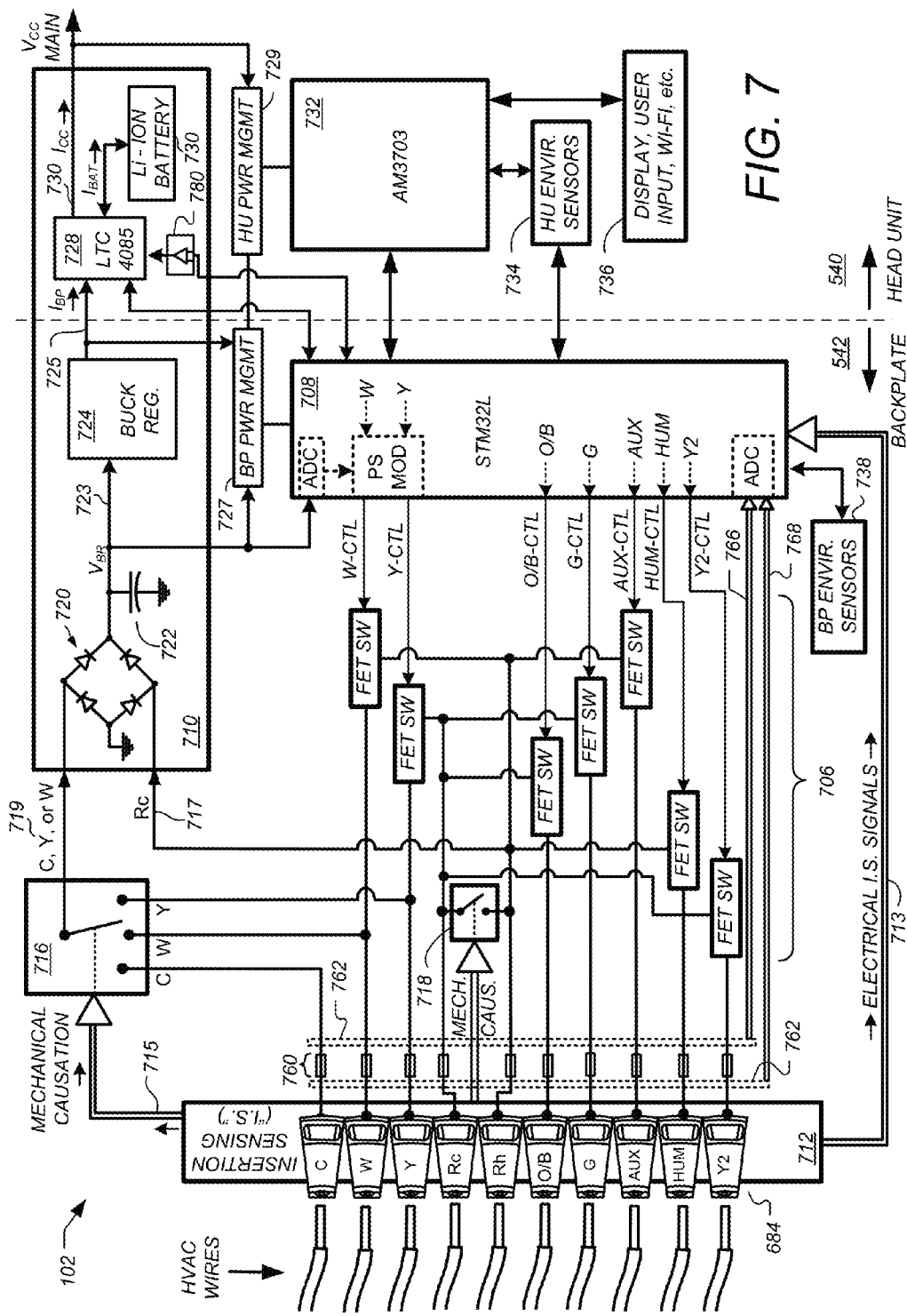
FIG. 7 is a block diagram illustrating circuitry within a thermostat, according to some embodiments.

FIG. 7 illustrates a thermostat 102 according to a preferred embodiment, the thermostat 102 comprising selected feature combinations that have been found to be particularly advantageous for the facilitation of do-it-yourself thermostat installation, the accommodation of a variety of different practical installation scenarios (including scenarios where a "C" power wire is not available), the provisioning of relatively power-intensive advanced interfaces and functionalities (e.g., a large visually pleasing electronic display, a relatively powerful general purpose microprocessor, and a reliable Wi-Fi communications chip) even where a "C" power wire is not available, the facilitation of operational robustness and durability, compact device size, quietness of operation, and other advantageous characteristics described in the instant disclosure and/or the commonly assigned incorporated applications. In the discussion that follows, the following HVAC wiring shorthand notations are used: W (heat call relay wire); Y (cooling call relay wire); Y2 (second stage cooling call relay wire); Rh (heat call relay power); Rc (cooling call relay power); G (fan call relay wire); O/B (heat pump call relay wire); AUX (auxiliary call relay wire); HUM (humidifier call relay wire); and C (common wire).

The Rh wire, which leads to one side of the HVAC power transformer (or simply "HVAC transformer") that is associated with a heating call relay, can go by different names in the art, which can include heating call switch power wire, heat call power return wire, heat return wire, return wire for heating, or return for heating. The Rc wire, which leads to one side of the HVAC transformer that is associated with a cooling call relay, can likewise go by different names including cooling call switch power wire, cooling call power return wire, cooling return wire, return wire for cooling, or return for cooling. In the case of single-HVAC-transformer systems having both heating and cooling functions, it is one and the same HVAC power transformer that is associated with both the heating call relay and cooling call relay, and in such cases there is just a single wire, usually labeled "R", leading back to one side of that HVAC transformer, which likewise can go by different names in the art including call switch power wire, call relay power wire, call power return wire, power return wire, or simply return wire.

As illustrated generally in FIG. 7, the thermostat 102 comprises a head unit 540 and a backplate 542. The backplate 542 comprises a plurality of FET switches 706 used for carrying out the essential thermostat operations of connecting or "shorting" one or more selected pairs of HVAC wires together according to the desired HVAC operation. The details of FET switches 706, each of which comprises a dual back-to-back FET configuration, can be found elsewhere in the instant disclosure and/or in the commonly assigned U.S. Ser. No. 13/034,674, supra. The operation of each of the FET switches 706 is controlled by a backplate microcontroller 708 which can comprise, for example, an STM32L 32-bit ultra-low power ARM-based microprocessor available from ST Microelectronics.

Thermostat 102 further comprises powering circuitry 710 that comprises components contained on both the backplate 542 and head unit 540. Generally speaking, it is the purpose of powering circuitry 710 to extract electrical operating power from the HVAC wires and convert that power into a usable form for the many electrically-driven components of the thermostat 102. Thermostat 102 further comprises insertion sensing components 712 configured to provide automated mechanical and electrical sensing regarding the HVAC wires that are inserted into the thermostat 102. Thermostat 102 further comprises a relatively high-power head unit microprocessor 732, such as an AM3703 Sitara ARM microprocessor available from Texas Instruments, that provides the main general governance of the operation of the thermostat 102. Thermostat 102 further comprises head unit/backplate environmental sensors 734/738 (e.g., temperature sensors, humidity sensors, active IR motion sensors, passive IR motion sensors, ambient visible light sensors, accelerometers, ambient sound sensors, ultrasonic/infrasonic sound sensors, etc.), as well as other components 736 (e.g., electronic display devices and circuitry, user interface devices and circuitry, wired communications circuitry, wireless communications circuitry such as Wi-Fi and/or ZigBee chips) that are operatively coupled to the head unit microprocessor 732 and/or backplate microprocessor 708 and collectively configured to provide the functionalities described in the instant disclosure and/or the commonly assigned incorporated applications.

The insertion sensing components 712 include a plurality of HVAC wiring connectors 684, each containing an internal springable mechanical assembly that, responsive to the mechanical insertion of a physical wire thereinto, will mechanically cause an opening or closing of one or more dedicated electrical switches associated therewith. Exemplary configurations for each of the HVAC wiring connectors 684 can be found in the commonly assigned U.S. patent application Ser. No. 13/034,666, and co-pending U.S. patent application Ser. No. 13/624,878. With respect to the HVAC wiring connectors 684 that are dedicated to the C, W, Y, Rc, and Rh terminals, those dedicated electrical switches are, in turn, networked together in a manner that yields the results that are illustrated in FIG. 7 by the blocks 716 and 718. For clarity of presentation in FIG. 7, the block 716 is shown as being coupled to the internal sensing components 712 by virtue of double lines termed "mechanical causation," for the purpose of denoting that the output of block 716 is dictated solely by virtue of the particular combination of HVAC wiring connectors 714 into which wires have been mechanically inserted. More specifically, the output of block 716, which is provided at a node 719, is dictated solely by virtue of the particular combination of C, W, and Y connectors into which wires have been mechanically inserted. Still more specifically, the output of block 716 at node 719 is provided in accordance with the following rules: if a wire is inserted into the C connector, then the node 719 becomes the C node regardless of whether there are any wires inserted into the Y or W connectors; if no wire is inserted into the C connector and a wire is inserted into the Y connector, then the node 719 becomes the Y node regardless of whether there is a wire inserted into the W connector; and if no wire is inserted into either of the C or Y connectors, then the node 719 becomes the W node. Exemplary configurations for achieving the functionality of block 716 (as combined with components 712 and wiring connectors 714) can be found elsewhere in the instant disclosure and/or in the commonly assigned U.S. Ser. No. 13/034,678, supra. It is to be appreciated that, although mechanical causation for achieving the functionality of block 716 (as combined with components 712 and wiring connectors 714) has been found to be particularly advantageous for simplicity and do-it-yourself ("DIY") foolproofing, in other embodiments there can be similar functionalities carried out electrically, magnetically, optically, electro-optically, electro-mechanically, etc. without departing from the scope of the present teachings. Thus, for example, similar results could be obtained by using optically, electrically, and/or magnetically triggered wire insertion sensing components that are coupled to relays or electronic switches that carry out the functionality of block 716 (as combined with components 712 and wiring connectors 714) without departing from the scope of the present teachings.

Likewise, for clarity of presentation in FIG. 7, the block 718 is also shown as being coupled to the internal sensing components 712 by virtue of double lines termed "mechanical causation," for the purpose of denoting that its operation, which is either to short the Rc and Rh nodes together or not to short the Rc and Rh nodes together, is dictated solely by virtue of the particular combination of HVAC wiring connectors 714 into which wires have been mechanically inserted. More specifically, whether the block 718 will short, or not short, the Rc and Rh nodes together is dictated solely by virtue of the particular combination of Rc and Rh connectors into which wires have been mechanically inserted. Still more specifically, the block 718 will keep the Rc and Rh nodes shorted together, unless wires have been inserted into both the Rc and Rh connectors, in which case the block 718 will not short the Rc and Rh nodes together because a two-HVAC-transformer system is present. Exemplary configurations for achieving the functionality of block 718 (as combined with components 712 and wiring connectors 684) can be found elsewhere in the instant disclosure and/or in the commonly assigned U.S. Ser. No. 13/034,674, supra. It is to be appreciated that, although mechanical causation for achieving the functionality of block 718 (as combined with components 712 and wiring connectors 684) has been found to be particularly advantageous for simplicity and do-it-yourself ("DIY") foolproofing, in other embodiments there can be similar functionalities carried out electrically, magnetically, optically, electro-optically, electro-mechanically, etc., in different combinations, without departing from the scope of the present teachings. Thus, for example, similar results could be obtained by using optically, electrically, and/or magnetically triggered wire insertion sensing components that are coupled to relays or electronic switches that carry out the functionality of block 718 (as combined with components 712 and wiring connectors 684) without departing from the scope of the present teachings.

As illustrated in FIG. 7, the insertion sensing circuitry 712 is also configured to provide electrical insertion sensing signals 713 to other components of the thermostat 102, such as the backplate microcontroller 708. Preferably, for each of the respective HVAC wiring terminal 714, there is provided at least two signals in electrical form to the microcontroller 708, the first being a simple "open" or "short" signal that corresponds to the mechanical insertion of a wire, and the second being a voltage or other level signal (in analog form or, optionally, in digitized form) that represents a sensed electrical signal at that terminal (as measured, for example, between that terminal and an internal thermostat ground node). Exemplary configurations for providing the sensed voltage signal can be found elsewhere in the instant disclosure and/or in the commonly assigned U.S. Ser. No. 13/034, 674, supra. The first and second electrical signals for each of the respective wiring terminals can advantageously be used as a basis for basic "sanity checking" to help detect and avoid erroneous wiring conditions. For example, if there has been a wire inserted into the "C" connector, then there should be a corresponding voltage level signal sensed at the "C" terminal, and if that corresponding voltage level signal is not present or is too low, then an error condition is indicated because there should always be a voltage coming from one side of the HVAC power transformer (assuming that HVAC system power is on, of course). As another example, if there has been a wire inserted into the "O/B" connector (heat pump call relay wire) but no wire has been inserted into the "Y" connector (cooling call relay wire), then an error condition is indicated because both of these wires are needed for proper heat pump control. Exemplary ways for conveying proper and/or improper wiring status information to the user can be found elsewhere in the instant disclosure and/or in the commonly assigned U.S. Ser. No. 13/269,501, supra.

Basic operation of each of the FET switches 706 is achieved by virtue of a respective control signal (OFF or ON) provided by the backplate microcontroller 708 that causes the corresponding FET switch 706 to "connect" or "short" its respective HVAC lead inputs for an ON control signal, and that causes the corresponding FET switch 706 to "disconnect" or "leave open" or "open up" its respective HVAC lead inputs for an OFF control signal. For example, the W-Rh FET switch keeps the W and Rh leads disconnected from each other unless there is an active heating call, in which case the W-Rh FET switch shorts the W and Rh leads together. As a further example, the Y-Rc FET switch keeps the Y and Rc leads disconnected from each other unless there is an active cooling call, in which case the Y-Rc FET switch shorts the Y and Rc leads together. (There is one exception to this basic operation for the particular case of "active power stealing" that is discussed in more detail infra, in which case the FET switch corresponding to the HVAC lead from which power is being stolen is opened up for very brief intervals during an active call involving that lead. Thus, if power-stealing is being performed using the Y lead, then during an active cooling call the Y-Rc FET switch is opened up for very brief intervals from time to time, these brief intervals being short enough such that the Y HVAC relay does not un-trip.)

Advantageously, by virtue of the above-described operation of block 718, it is automatically the case that for single-transformer systems having only an "R" wire (rather than separate Rc and Rh wires as would be present for two-transformer systems), that "R" wire can be inserted into either of the Rc or Rh terminals, and the Rh-Rc nodes will be automatically shorted to form a single "R" node, as needed for proper operation. In contrast, for dual-transformer systems, the insertion of two separate wires into the respective Rc and Rh terminals will cause the Rh-Rc nodes to remain disconnected to maintain two separate Rc and Rh nodes, as needed for proper operation. The G-Rc FET switch keeps the G and Rc leads disconnected from each other unless there is an active fan call, in which case the G-Rc FET switch shorts the G and Rc leads together (and, advantageously, the proper connection will be achieved regardless of whether the there is a single HVAC transformer or dual HVAC transformers because the Rc and Rh terminals will be automatically shorted or isolated accordingly). The AUX-Rh FET switch keeps the AUX and Rh leads disconnected from each other unless there is an active AUX call, in which case the AUX-Rh FET switch shorts the AUX and Rh leads together (and, advantageously, the proper connection will be achieved regardless of whether the there is a single HVAC transformer or dual HVAC transformers because the Rc and Rh terminals will be automatically shorted or isolated accordingly). The Y2-Rc FET switch keeps Y2 and Rc disconnected from each other unless that is an active Y2 call, in which case the Y2-Rc FET switch shorts the Y2 and Rh leads. The HUM-Rh FET switch keeps HUM and Rh disconnected from each other unless that is an active HUM call, in which case the HUM-Rh FET switch shorts the HUM and Rh leads. For heat pump calls, the O/B-Rc FET switch and Y-Rc FET switch are jointly operated according to the required installation-dependent convention for forward or reverse operation (for cooling or heating, respectively), which convention can advantageously be determined automatically (or semi-automatically using feedback from the user) by the thermostat 102 as described further in the commonly assigned International Patent Application No. PCT/US12/30084, which is incorporated by reference herein.

Referring now to the powering circuitry 710 in FIG. 7, advantageously provided is a configuration that automatically adapts to the powering situation presented to the thermostat 102 at the time of installation and thereafter in a manner that has been found to provide a good combination of robustness, adaptability, and foolproofness. The powering circuitry 710 comprises a full-wave bridge rectifier 720, a storage and waveform-smoothing bridge output capacitor 722 (which can be, for example, on the order of 30 microfarads), a buck regulator circuit system 724, a power-and-battery (PAB) regulation circuit 728, and a rechargeable lithium-ion battery 730. In conjunction with other control circuitry including backplate power management circuitry 727, head unit power management circuitry 729, and the microcontroller 708, the powering circuitry 710 is configured and adapted to have the characteristics and functionality described hereinbelow. Description of further details of the powering circuitry 710 and associated components can be found elsewhere in the instant disclosure and/or in the commonly assigned U.S. patent application Ser. No. 13/034,678 and U.S. Ser. No. 13/267,871, both of which are incorporated by reference herein.

By virtue of the configuration illustrated in FIG. 7, when there is a "C" wire presented upon installation, the powering circuitry 710 operates as a relatively high-powered, rechargeable-battery-assisted AC-to-DC converting power supply. When there is not a "C" wire presented, the powering circuitry 710 operates as a power-stealing, rechargeable-battery-assisted AC-to-DC converting power supply. As illustrated in FIG. 7, the powering circuitry 710 generally serves to provide the voltage Vcc MAIN that is used by the various electrical components of the thermostat 102, and that in one embodiment will usually be about 3.7V-3.95V. As used herein, "thermostat electrical power load" refers to the power that is being consumed by the various electrical components of the thermostat 700. Thus, the general purpose of powering circuitry 710 is to judiciously convert the 24VAC presented between the input leads 719 and 717 to a steady 3.7~3.95 VDC output at the Vcc MAIN node to supply the thermostat electrical power load. Details relating to bootstrap circuitry (not shown), whose purpose is to provide electrical power for powering the backplate that assists in device start-up and that can act as a kind of short term safety net, are omitted from the present discussion for purposes of clarity of description, although further information on such circuitry can be found in U.S. patent application Ser. No. 13/034,678, which is incorporated by reference herein.

Operation of the powering circuitry 710 for the case in which the "C" wire is present is now described. Although the powering circuitry 710 may be referenced as a "power-stealing" circuit in the general sense of the term, the mode of operation for the case in which the "C" wire is present does not constitute "power stealing" per se, because there is no power being "stolen" from a wire that leads to an HVAC call relay coil (or to the electronic equivalent of an HVAC call relay coil for some newer HVAC systems). For the case in which the "C" wire is present, there is no need to worry about accidentally tripping (for inactive power stealing) or untripping (for active power stealing) an HVAC call relay, and therefore relatively large amounts of power can be assumed to be available from the input at nodes 719/717. When the 24VAC input voltage between nodes 719 and 717 is rectified by the full-wave bridge rectifier 720, a DC voltage at node 723 is present across the bridge output capacitor 722, and this DC voltage is converted by the buck regulator system 724 to a relatively steady voltage, such as 4.4 volts, at node 725, which provides an input current $I_{BP}$ to the power-and-battery (PAB) regulation circuit 728.

The microcontroller 708 controls the operation of the powering circuitry 710 at least by virtue of control leads leading between the microcontroller 708 and the PAB regulation circuit 728, which for one embodiment can include an LTC4085-4 chip available from Linear Technologies Corporation. The LTC4085-4 is a USB power manager and Li-Ion/Polymer battery charger originally designed for portable battery-powered applications. The PAB regulation circuit 728 provides the ability for the microcontroller 708 to specify a maximum value $I_{BP}(max)$ for the input current $I_{BP}$. The PAB regulation circuit 728 is configured to keep the input current at or below $I_{BP}(max)$, while also providing a steady output voltage Vcc, such as 4.0 volts, while also providing an output current Icc that is sufficient to satisfy the thermostat electrical power load, while also tending to the charging of the rechargeable battery 730 as needed when excess power is available, and while also tending to the proper discharging of the rechargeable battery 730 as needed when additional power (beyond what can be provided at the maximum input current $I_{BP}(max)$) is needed to satisfy the thermostat electrical power load. If it is assumed for the sake of clarity of explanation that the voltages at the respective input, output, and battery nodes of the PAB regulation circuit 728 are roughly equal, the functional operation of the PAB regulation circuit 728 can be summarized by relationship $I_{BP}=Icc+I_{BAT}$, where it is the function of the PAB regulation circuit 728 to ensure that $I_{BP}$ remains below $I_{BP}(max)$ at all times, while providing the necessary load current Icc at the required output voltage Vcc even for cases in which Icc is greater than $I_{BP}(max)$. The PAB regulation circuit 728 is configured to achieve this goal by regulating the value of $I_{BAT}$ to charge the rechargeable battery 730 ($I_{BAT}>0$) when such charge is needed and when Icc is less than $I_{BP}(max)$, and by regulating the value of $I_{BAT}$ to discharge the rechargeable battery 730 ($I_{BAT}<0$) when Icc is greater than $I_{BP}(max)$. Note that in cases where less current Icc is needed, PAB regulation circuit 728 does not need to regulate the 4.4V at node 725 to a lower value.

For one embodiment, for the case in which the "C" wire is present, the value of $I_{BP}(max)$ for the PAB regulation circuit 728 is set to a relatively high current value, such as 150 mA, by the microcontroller 708. Assuming a voltage of about 4.4 volts at node 725, this corresponds to a maximum output power from the buck regulator system 724 of about 660 mW. Advantageously, by virtue of the rechargeable battery-assisted operation described above, the powering circuitry 710 can provide instantaneous thermostat electrical power load levels higher than 660 mW on an as-needed basis by discharging the rechargeable battery, and then can recharge the rechargeable battery once the instantaneous thermostat electrical power load goes back down. Generally speaking, depending especially on the instantaneous power usage of the large visually pleasing electronic display (when activated by the user coming close or manipulating the user interface), the high-powered microprocessor 732 (when not in sleep mode), and the Wi-Fi chip (when transmitting), the instantaneous thermostat electrical power load can indeed rise above 660 mW by up to several hundred additional milliwatts. For preferred embodiments in which the rechargeable battery 730 has a capacity in the several hundreds of milliamp-hours (mAh) at or near the nominal Vcc voltage levels (e.g., 560 mAh at 3.7 volts), supplying this amount of power is generally not problematic, even for extended time periods (even perhaps up to an hour or more), provided only that there are sufficient periods of lower-power usage below 660 mW in which the rechargeable battery 730 can be recharged. The thermostat 102 is configured such that this is easily the case, and indeed is designed such that the average power consumption is below a much lower threshold power than this, as discussed further below in the context of "active power stealing."

Operation of the powering circuitry 710 for the case in which the "C" wire is not present is now described. For such case, in accordance with the above-described operation of insertion sensing components/switches 712/716, it will be the Y-lead that is connected to the node 719 if a "Y" wire has been inserted, and it will otherwise be the W-lead that is connected to the node 719 if no "Y" wire has been inserted. Stated differently, it will be the Y-lead from which "power is stolen" if a "Y" wire has been inserted, and it will otherwise be the W-lead from which "power is stolen" if no "Y" wire has been inserted. As used herein, "inactive power stealing" refers to the power stealing that is performed during periods in which there is no active call in place based on the lead from which power is being stolen. Thus, for cases where it is the "Y" lead from which power is stolen, "inactive power stealing" refers to the power stealing that is performed when there is no active cooling call in place. As used herein, "active power stealing" refers to the power stealing that is performed during periods in which there is an active call in place based on the lead from which power is being stolen. Thus, for cases where it is the "Y" lead from which power is stolen, "active power stealing" refers to the power stealing that is performed when there is an active cooling call in place.

Operation of the powering circuitry 710 for "inactive power stealing" is now described. In the description that follows it will be assumed that the "Y" wire has been inserted and therefore that power is to be stolen from the Y-lead, with it being understood that similar counterpart operation based on the "W" lead applies if no "Y" wire has been inserted and power is to be stolen from the W-lead. During inactive power stealing, power is stolen from between the "Y" wire that appears at node 719 and the Rc lead that appears at node 717. As discussed previously, the Rc lead will be automatically shorted to the Rh lead (to form a single "R" lead) for a single-HVAC transformer system, while the Rc lead will be automatically segregated from the Rh lead for a dual-HVAC transformer system. In either case, there will be a 24VAC HVAC transformer voltage present across nodes 719/717 when no cooling call is in place (i.e., when the Y-Rc FET switch is open). For one embodiment, the maximum current $I_{BP}$(max) is set to a relatively modest value, such as 20 mA, for the case of inactive power stealing. Assuming a voltage of about 4.4 volts at node 725, this corresponds to a maximum output power from the buck regulator system 724 of about 88 mW. The power level of 88 mW has been found to be a generally "safe" power stealing level for inactive power stealing, where the term "safe" is used to indicate that, at such power level, all or virtually all HVAC cooling call relays that are installed in most residential and commercial HVAC systems will not accidentally trip into an "on" state due to the current following through the cooling call relay coil. During this time period, the PAB regulator 728 operates to discharge the battery 730 during any periods of operation in which the instantaneous thermostat electrical power load rises above 88 mW, and to recharge the battery (if needed) when the instantaneous thermostat electrical power load drops below 88 mW. Provided that the rechargeable battery 730 is selected to have sufficient capacity (such as 560 mAh at 3.7 volts as discussed above), supplying power at above 88 mW (even several hundred milliwatts more) is generally not problematic even for extended time periods (even perhaps up to an hour or more), provided only that there are sufficient periods of lower-power usage below 88 mW in which the rechargeable battery 730 can be recharged. The thermostat 700 is configured such that the average power consumption is well below 88 mW, and indeed for some embodiments is even below 10 mW on a long-term time average.

According to one embodiment, the powering circuitry 710 is further monitored and controlled during inactive power stealing by the microcontroller 708 by virtue of monitoring the voltage $V_{BR}$ across the bridge output capacitor 722 at node 723 that leads into the buck regulator 724. For the embodiment of FIG. 7, the voltage $V_{BR}$ is monitored directly by virtue of an analog to digital converter ("ADC") that is built into the microcontroller 708. According to an embodiment, the voltage $V_{BR}$ across the bridge output capacitor 722 can be monitored, either on a one-time basis, a periodic basis, or a continuous basis to assess a general "strength" of the HVAC system with respect to the power that can be safely provided during inactive power stealing. This assessment can then be used to adjust a determination for the maximum "safe" amount of power that can be provided at the output of buck regulator 724 during inactive power stealing, which can in turn be implemented by the microcontroller 708 by setting the maximum input current $I_{BP}$(max) of the PAB regulator 728 for inactive power stealing. In one particularly advantageous embodiment, at the outset of an inactive power stealing period (either on a one-time basis after thermostat installation or on ongoing basis as desired), the microcontroller 708 initially sets the maximum current $I_{BP}$(max) to zero and measures the resultant voltage $V_{BR}$. This "open-circuit" value of $V_{BR}$ will typically be, for example, somewhere around 30 volts. The microcontroller 708 then sets the maximum current $I_{BP}$(max) to 20 mA and measures the resultant voltage $V_{BR}$. If the value of $V_{BR}$ when $I_{BP}$(max)=20 mA remains roughly the same as its open-circuit value (less than a predetermined threshold difference, for example), then it is determined that the HVAC system is "strong enough" at the Y-lead to accommodate a higher value for the maximum current $I_{BP}$(max), and the microcontroller 708 increases the maximum current $I_{BP}$(max) to 40 mA (corresponding to a maximum "safe" power stealing level of about 176 mW assuming 4.4 volts). On the other hand, if the value of $V_{BR}$ when $I_{BP}$(max)=20 mA tends to sag relative to its open-circuit value (greater than the predetermined threshold difference, for example), then it is determined that the HVAC system is not "strong enough" at the Y-lead to accommodate an increased maximum current $I_{BP}$(max), and its value will remain fixed at 20 mA. Optionally, this process can be repeated to further increase the maximum current $I_{BP}$(max) to successively higher levels, although care should be taken to ensure by empirical testing with a target population of HVAC systems that the cooling call relay will not be tripped at such higher levels during inactive power stealing. For one embodiment, the process stops when $I_{BP}$(max)=40 mA, to avoid accidental cooling call relay tripping across a very large population of HVAC systems.

According to some embodiments, instead of a simple 0/8/20/40/100 milliamp current setting for $I_{BP}$ by microcontroller 708, as describe hereinabove, control of the PAB regulator 728 is set to a "fine dynamic range" between 0-150 milliamps. According to one embodiment, PAB regulator 728 is driven by an analog signal generated at an output pin of the microcontroller 708 and through a small op-amp circuit 780 to an analog-level input control lead of PAB regulator 728. The microcontroller 708 uses a 12-bit signal to convert to a voltage, thereby allowing for 12 bits of control over the range from 0 to 150 mA for $I_{BP}$. According to some embodiments, the thermostat 102 implements an increment/decrement algorithm such as shown and described with respect to FIG. 8 of co-pending U.S. Patent Publication No. 2012-0199660A1, which is incorporated by reference herein, to "fine tune" the optimal safe current $I_{BP}$. Such fine tuning of $I_{BP}$ leads to greater flexibility balancing the use of relatively power intensive components (such as the user interface, Wi-Fi and the head unit microcontroller), while in keeping the battery adequately charged and reducing the likelihood of accidental tripping of the HVAC system.

Operation of the powering circuitry 710 for "active power stealing" is now described. In the description that follows it will be assumed that the "Y" wire has been inserted and therefore that power is to be stolen from the Y-lead, with it being understood that similar counterpart operation based on the "W" lead applies if no "Y" wire has been inserted. During an active cooling call, it is necessary for current to be flowing through the HVAC cooling call relay coil sufficient to maintain the HVAC cooling call relay in a "tripped" or ON state at all times during the active cooling call. In the absence of power stealing, this would of course be achieved by keeping the Y-Rc FET switch 706 in ON state at all times to short the Y and Rc leads together. To achieve active power stealing, the microcontroller 708 is configured by virtue of circuitry denoted "PS MOD" to turn the Y-Rc FET switch OFF for small periods of time during the active cooling call, wherein the periods of time are small enough such that the cooling call relay does not "un-trip" into an OFF state, but wherein the periods of time are long enough to allow inrush of current into the bridge rectifier 720 to keep the bridge output capacitor 722 to a reasonably acceptable operating level. For one embodiment, this is achieved in a closed-loop fashion in which the microcontroller 708 monitors the voltage $V_{BR}$ at node 723 and actuates the signal Y-CTL as necessary to keep the bridge output capacitor 722 charged. By way of example, during active power stealing operation, the microcontroller 708 will maintain the Y-Rc FET switch in an ON state while monitoring the voltage $V_{BR}$ until it drops below a certain lower threshold, such as 8 volts. At this point in time, the microcontroller 708 will switch the Y-Rc FET switch into an OFF state and maintain that OFF state while monitoring the voltage $V_{BR}$, which will rise as an inrush of rectified current charges the bridge capacitor 722. Then once the voltage $V_{BR}$ rises above a certain upper threshold, such as 10 volts, the microcontroller 708 will turn the Y-Rc FET switch back into in an ON state, and the process continues throughout the active power stealing cycling. Although the scope of the present teachings is not so limited, the microcontroller 708 is preferably programmed to keep the maximum current $I_{BP}$(max) to a relatively modest level, such as 20 mA (corresponding to a maximum "safe" power stealing level of about 88 mW assuming 4.4 volts) throughout the active power stealing cycle. The circuit elements are designed and configured such that the ON-OFF cycling of the Y-Rc FET switch occurs at a rate that is much higher than 60 Hz and generally has no phase relationship with the HVAC power transformer, whereby the specter of problems that might otherwise occur due to zero crossings of the 24VAC voltage signal are avoided. By way of example and not by way of limitation, for some embodiments the time interval required for charging the bridge output capacitor 722 from the lower threshold of 8 volts to the upper threshold of 10 volts will be on the order 10 to 100 microseconds, while the time that it takes the bridge output capacitor 722 to drain back down to the lower threshold of 8 volts will be on the order of 1 to 10 milliseconds. It has been found that, advantageously, at these kinds of rates and durations for the intermittent "OFF" state of the Y-Rc FET switch 706, there are very few issues brought about by accidental "un-tripping" of the HVAC cooling call relay during active power stealing across a wide population of residential and commercial HVAC installations.

According to one embodiment, it has been found advantageous to introduce a delay period, such as 60-90 seconds, following the instantiation of an active cooling cycle before instantiating the active power stealing process. This delay period has been found useful in allowing many real-world HVAC systems to reach a kind of "quiescent" operating state in which they will be much less likely to accidentally un-trip away from the active cooling cycle due to active power stealing operation of the thermostat 700. According to another embodiment, it has been found further advantageous to introduce another delay period, such as 60-90 seconds, following the termination of an active cooling cycle before instantiating the inactive power stealing process. This delay period has likewise been found useful in allowing the various HVAC systems to reach a quiescent state in which accidental tripping back into an active cooling cycle is avoided. Preferably, the microcontroller 708 implements the above-described instantiation delays for both active and inactive power stealing by setting the maximum current $I_{BP}$(max) to zero for the required delay period. In some embodiments, the operation of the buck regulator circuit 724 is also shut down for approximately the first 10 seconds of the delay period to help ensure that the amount of current being drawn by the powering circuitry 710 is very small. Advantageously, the rechargeable-battery-assisted architecture of the powering circuitry 710 readily accommodates the above-described instantiation delays in that all of the required thermostat electrical power load can be supplied by the rechargeable battery 730 during each of the delay periods.

According to some embodiments, protection fuses 760 are included in the backplate 542, with one protection fuse being located in series just after each of the connection terminals 684. As used herein the term "fuse" means any sacrificial device that provides overcurrent protection. In thermostat 102, the protection fuses 760 are provided as a protection against an over-current condition, and they have been found to be particularly useful as a failsafe since thermostat 102 is designed for non-expert, do-it-yourself installation. One example of a wiring mistake during installation is when a user accidentally connects the C wire to the Y connection terminal. In normal wiring, there is a "load" on the Y circuit in the form of, for example, a relay for turning on an air conditioning compressor. However, in the case there the C wire is accidentally connected to the Y terminal, there is no "load" element on the Y circuit. As a result, the first time the thermostat calls for cooling, the Y-Rc FET switch connects Y and Rc, which results in a short circuit directly across the HVAC power transformer. The protection fuse 760 associated with the Y terminal blows as a result. Note that there is also a protection fuse 760 on the Rc terminal but it is rated higher and therefore probably does not also blow. After the protection fuse 760 on the Y terminal blows, thermostat 102 is able to detect an error because no voltage is measured on the Y circuit even though a wire is physically inserted (which is known by virtue of mechanical insertion sensing). However, if there is no fuse status sensing features, as will be described hereinbelow, a blown fuse cannot be distinguished from some other condition such as a dead wire (where the inserted wire is disconnected somewhere else in the HVAC system wiring), or another HVAC component has a blown fuse.

Thus according to some embodiments, protection fuse status sensing capability is provided with thermostat 102. In FIG. 7 voltage detection circuitry 762 is provided on each side of each of the fuses 760, such that a determination can be made as to the status of the fuse. The circuitry 762, for example can include voltage dividers to bring the voltages down to a level on lines 766 and 768 that they can be sensed by an ADC in the microprocessor 708. It is understood that although double lines are used for circuitry 762, 766 and 768 for reasons of clarity in FIG. 7, individual circuits and circuit paths are provided for each side of each fuse. When a blown fuse is detected by microprocessor 708, according to some embodiments, the user can be notified via (1) an error message on the thermostat display, and/or (2) a message on another device such as a mobile device and/or web-client device. According to some embodiments the thermostat manufacturer is notified via network connection. Further details of error notifications will be provided with respect to FIG. 10, infra. By providing for fuse status sensing, thermostat 102 is better adapted for installation by a non-expert installer. Since it can be determined that the fuse is blown, the user can be asked to return the thermostat to the manufacturer. If the fuse is not blown and a mismatch between the physical wire and the expected voltage, the user can be guided in resolving the issue.

Figure 8:
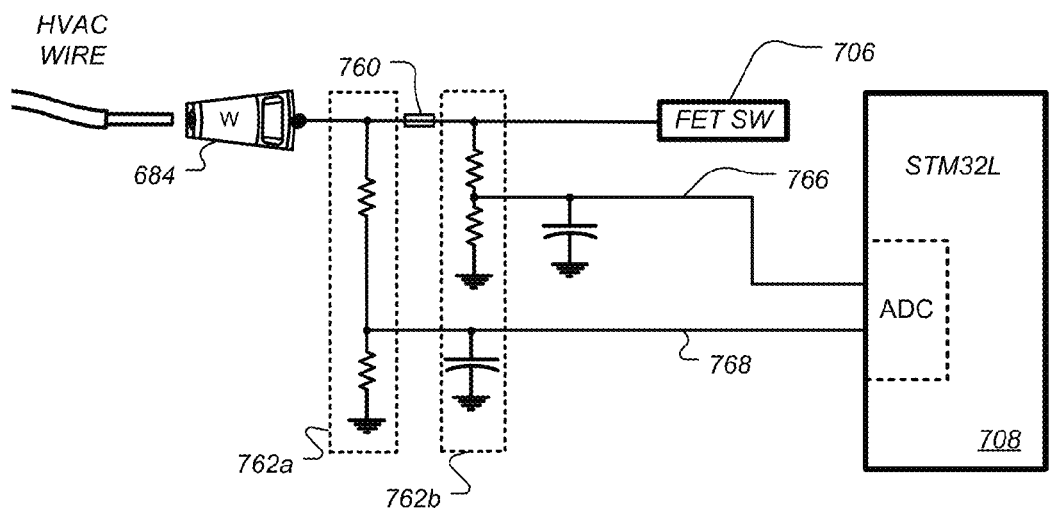
FIG. 8 is a diagram showing further details of the protection fuse status sensing components, according to some embodiments.

FIG. 8 is a diagram showing further details of the protection fuse status sensing components, according to some embodiments. In this example, a protection fuse 760 is provided in series with the W wire connection terminal 684. Voltage dividers 762a and 762b are used to step down the voltages on either side of the fuse 760 to a level that is suitable for detection by an analog-to-digital (ADC) converter on microprocessor 708. By comparing the voltage on lines 766 and 768, a blown fuse can be easily distinguished from other errors, such connection of a dead wire to the thermostat.

Figure 9A:
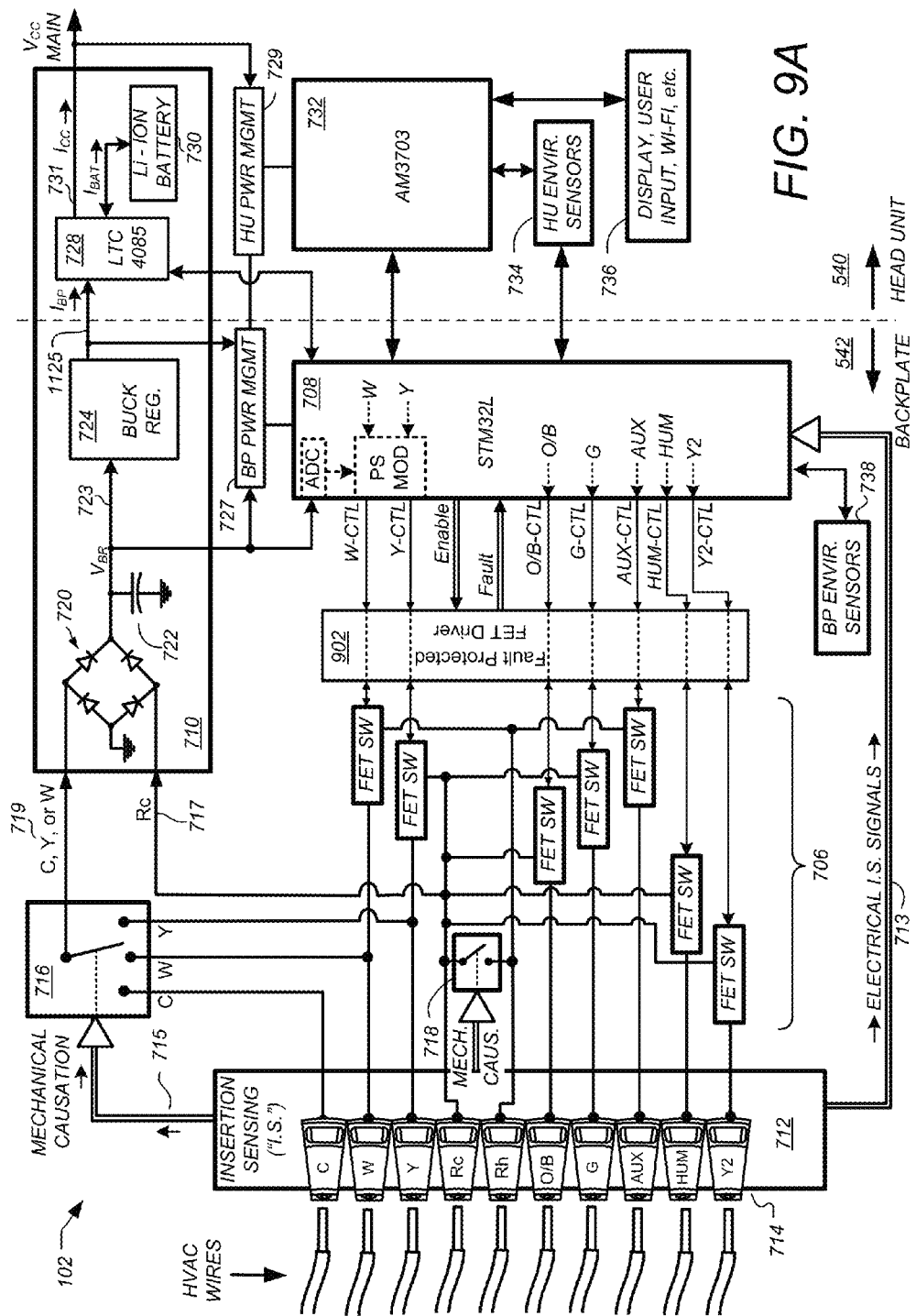
FIGS. 9A-9B are diagrams showing a thermostat having circuitry for automatically shutting-off FET switches when over-current is detected, according to some embodiments.
Figure 9B:
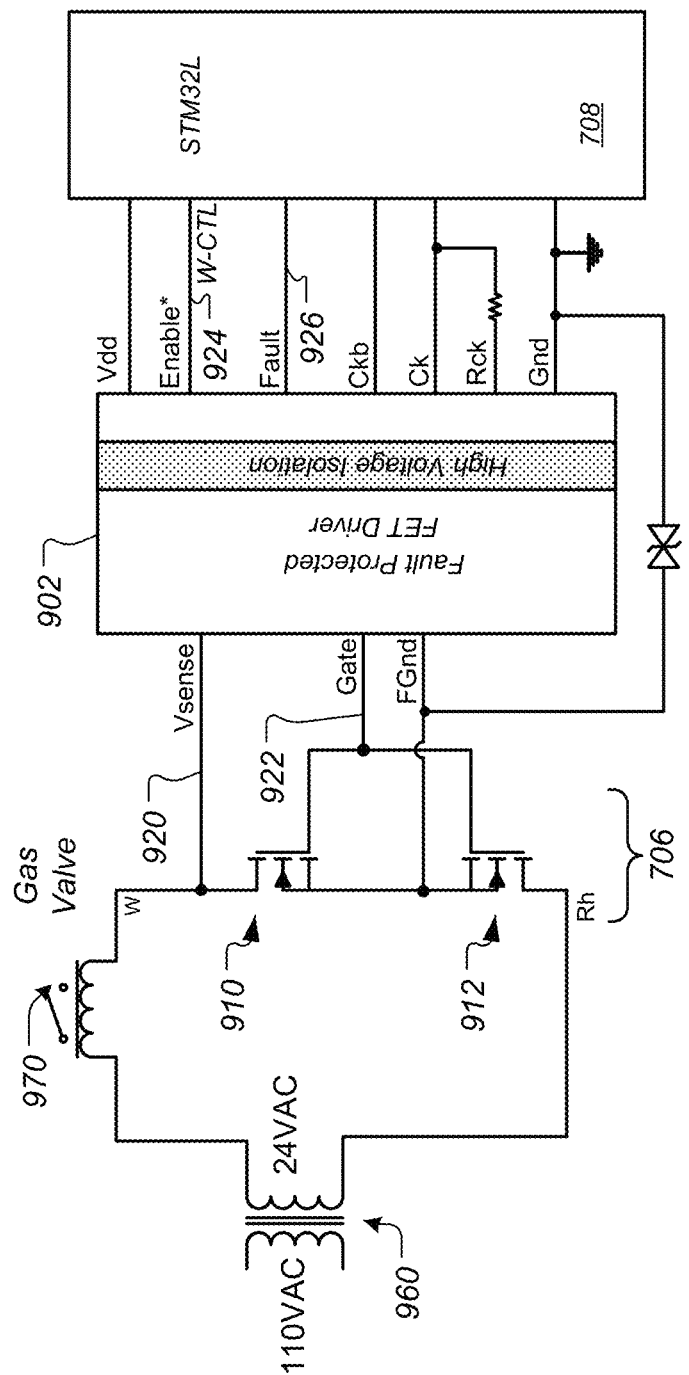

FIGS. 9A-9B are diagrams showing a thermostat having circuitry for automatically shutting-off FET switches when over-current is detected, according to some embodiments. In the case shown in FIG. 9A, thermostat 102 includes current-limited FET switches are used instead of (or in addition to) conventional protection fuses. A fault protected FET driver 902 is provided that is able to detect an over-current condition on each individual FET switch. If an over-current is detected, the FET switch is immediately turned off and a fault indictor is sent to the microcontroller 708. The FET switch then remains "off" until it is re-enabled under control of the microcontroller. If the fault indicator is received by the microcontroller 708, then error messages are displayed and/or sent as described above. If the fault has been resolved (for example wires to thermostat are changed) then the microcontroller 708 re-enables the FET switch. According to some embodiments, there are separate fault and enable signals dedicated to each of the FET switches.

FIG. 9B is a diagram showing further details of detection and shut-off using fault protected FET drive circuitry. Shown is the case of connections to the W-Rh FET switch. In particular, HVAC power transformer 960 supplies 24VAC, and gas valve 970 is the "load" on the W wire. The fault protected FET driver 902, according to some embodiments, is designed to drive the back-to-back MOSFETs 910 and 912 (which make up a FET switch 706 in FIG. 9A). The fault and enable* lines 926 and 924, respectively, which are connected to microcontroller 708 are isolated from the AC voltage lines by high voltage isolation barrier inside of the integrated circuit. According to some embodiments, there is also a power supply provided in the form of a differential clock signal as shown. According to some embodiments, there is also a voltage rail Vdd connected to provide a reference level for logic signals. When an enable input signal from microcontroller 708 is high impedance, the driver 902 turns off the MOSFETs 910 and 912. When the enable* line 924 is pulled low by microcontroller 708, the driver 902 turns on the MOSFETs 910 and 912. When FETs 910 and 912 are turn ON (i.e. the FET switch is "connected") current in the loop activates the gas valve 970 and the HVAC heating function is initiated. The driver 902 is configured to sense drain voltage 920 of the MOSFETs to detect an over-current condition. If an over-current condition is detected, the driver 902 turns off the MOSFETs 910 and 912 immediately and generates a fault indicator 926 to the microprocessor 926. If there is faulty wiring, for example the load 970 is not attached in series, as in the case of a user accidentally connecting a C wire to the W terminal, activating the FETs 910 and 912 will cause an over-current condition. Driver 902 will detect the over-current condition and immediately shut off the MOSFETs 910 and 912. The Driver will send a fault signal 926 to the microcontroller 708. The head unit microcontroller 732 (shown in FIG. 9A) will be notified and the user will be alerted to the error. If the user can be guided to rectify the problem, for example by checking wiring and/or seeking help through remote resources at the manufacturer, the FETs can be re-enabled via software through the backplate microcontroller 708. If the problem has still not been resolved, the FETs may automatically shut off again and further troubleshooting can be undertaken.

Figure 10:
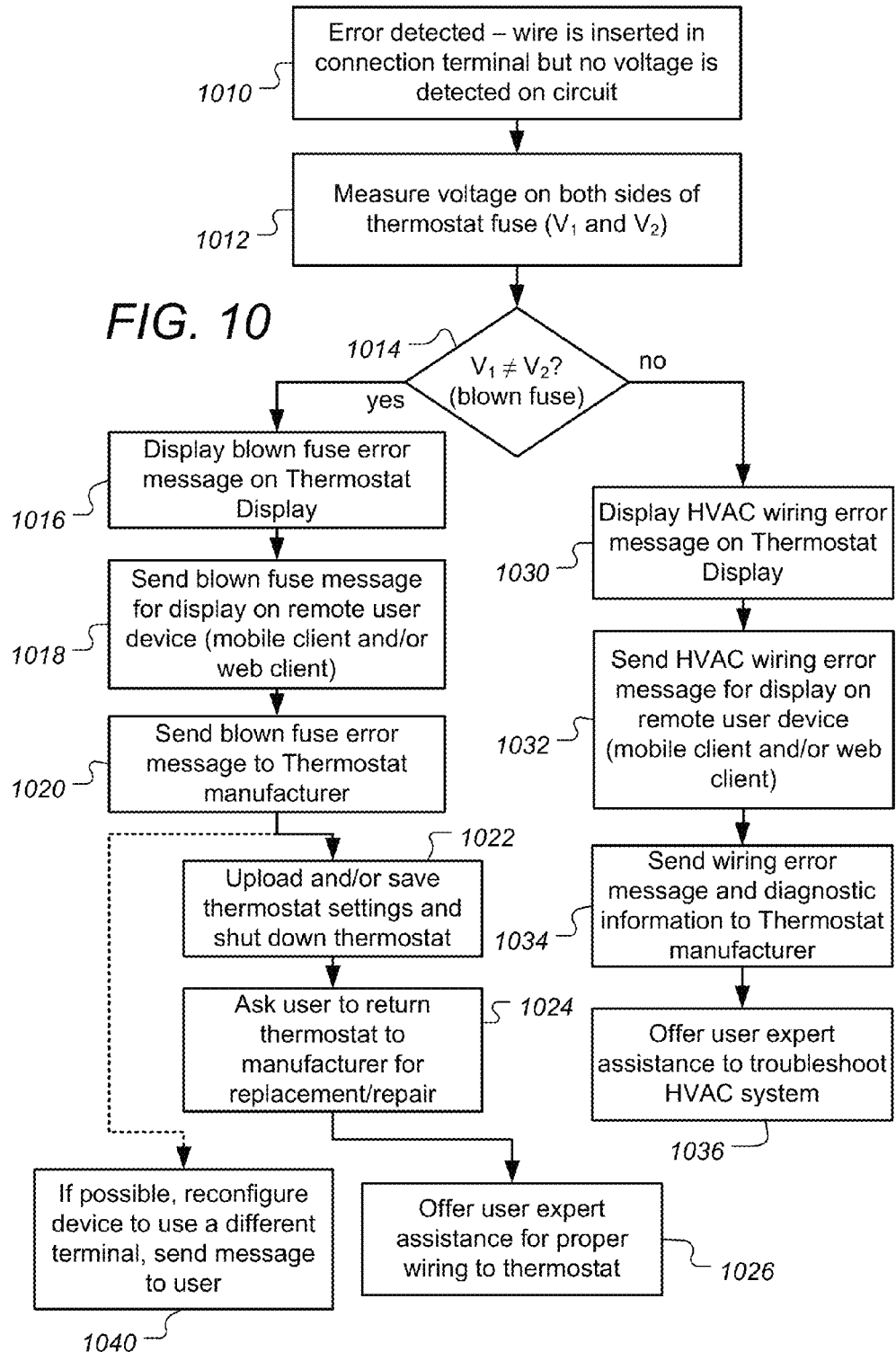
FIG. 10 is a flowchart showing aspects of notifying and guiding a user in the case of a wiring error, according to some embodiments.

FIG. 10 is a flowchart showing aspects of notifying and guiding a user in the case of a wiring error, according to some embodiments. In step 1010, a power error is detected, such as when a wire is physically inserted to a connection terminal but the voltage characteristics do not match what is expected for that terminal. In this example, a wire is inserted but not voltage can be detected. In step 1012, the voltage on both sides of a protection fuse are measured, such as with circuitry shown in FIGS. 7 and 8. A decision 1014 is made as to whether or not the protection fuse is blown by comparing the measured voltages. If the voltages are not equal then a blown protection fuse is indicated. In step 1016, the thermostat display is used shows a message that a fuse has blown. When a fuse is blown, generally the inside of the fuse (closest to the FET switch 706) will be close to zero, and the outside of the fuse (closest to connection terminal 684) will have a large signal. The message can be permanent, or it can be displayed periodically to conserve battery power. In step 1018, a message of the detected blown fuse is sent to a user on another device such as a mobile device and/or web-client device. This can be very useful in the case where there is limited battery life remaining in the thermostat, or when the thermostat should otherwise be shut down and therefore the thermostat's display will be inactive. In step 1020, according to some embodiments, the thermostat manufacturer is notified via network connection. If the thermostat is not usable with the blown fuse, in step 1022 the user's settings as well as detailed diagnostic information is saved and uploaded to a server prior to shutting down the thermostat. In step 1024 the user is asked to return the thermostat to the manufacturer for replacement or repair. This request can be made to the user via the thermostat display if available, and/or through a remote device such as a mobile device and/or web-client device. In step 1026, based on the diagnostics and other information, including other information received directly from the user, the user may be offered expert assistance to remedy the problem. In some cases this may include free technical assistance. In other cases, depending on the nature of the problem, an offer for paid expert service can be made.

According to some embodiments, in step 1040 a determination as to whether the thermostat is still usable is made. Depending on which terminal is blown and which wires are present, it is sometimes possible to reconfigure the thermostat 102 to use a different terminal so as to avoid returning the unit for repair and/or replacement. For example, if the particular HVAC system includes only two wires, Rc and Y, and the fuse 760 on the Y terminal is blown, then the user can be instructed to use the Y2 terminal instead of the Y terminal, and the microprocessors and microcontrollers are programmed to re-purpose the Y2-Rc FET switch to operate as Y-Rc FET switch had been.

In the case where the protection fuse is not blown, then in step 1030 the error condition is displayed on the thermostat display, and in step 1032 an attempt to notify the user via a remote device is also made. In step 1034 a notification of the wiring error and detailed diagnostic information is sent to the manufacturer. Based on the received information, the manufacturer in step 1036 is in a good position to offer assistance, including in some cases offering expert assistance to solve the problem. For example, if an HVAC system wiring problem is indicated, then the user can be offered an HVAC specialist to make a service call the user's residence.

According to some embodiments, an alternative method can be used to determine if a fuse is blown. In this case the user is instructed to disconnect all wires from the connection terminals 684, which can be verified using the mechanical wire sensing. A signal is then driven into one side of the fuse, for example by using a GPIO output on microcontroller 708. The other side of the fuse would then be monitored, using the ADC on microcontroller 708 see if a matching signal is received. If a sufficient match is detected, the fuse is not blown.

Thus, according to some embodiments, the information as to the status of a protection fuse can be used to greatly increase the chances of a user having a positive installation experience, especially in the case where the thermostat is being installed by a non-expert, such as a DIY setting. First of all a non-expert user is more likely than an expert installer to make a wiring error. Secondly, the non-expert user will usually not have access to electronic diagnostic equipment to detect what the problem is. By providing a self-diagnosing user-installable thermostat, it has been found that the vast majority of users can successfully perform the installation without expert assistance. And in the small minority of cases where expert assistance is needed, the self-diagnostic ability of the thermostat greatly assists in the user obtaining such service.

Figure 11:
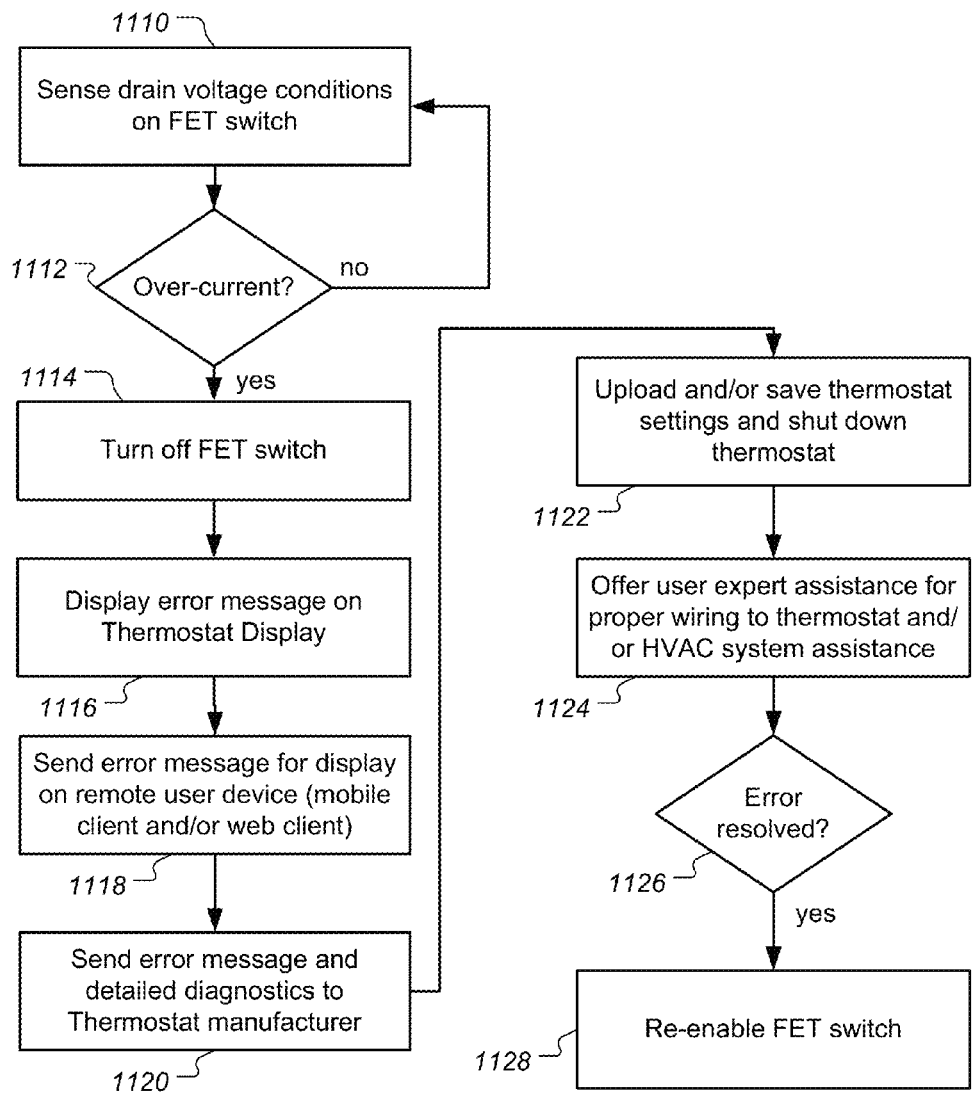
FIG. 11 is a flowchart showing aspects of over-current detection and notifications with a thermostat having automatic FET shut-off capability, such as shown FIGS. 9A-9B, according to some embodiments.

FIG. 11 is a flowchart showing aspects of over-current detection and notifications with a thermostat having automatic FET shut-off capability, such as shown FIGS. 9A-9B, according to some embodiments. In step 1110, the drain voltage of the FET switches are continuously monitored, such as described with driver 902 in FIG. 9B. In step 1112, if an over current condition is sensed, in step 1114 the FET switch is automatically and immediately shut off. The driver circuitry also sends a fault indicator to the backplate microcontroller, which then notifies the head unit microprocessor. In step 1116, the display is used to notify the user of the over current error. In step 1118, an attempt is made to send an error message through to a remote device such as a mobile and/or web client. This can be very useful in the case where there is limited battery life remaining in the thermostat, or when the thermostat should otherwise be shut down and therefore the thermostat's display will be inactive. In step 1120 the thermostat manufacturer is notified via network connection. According to some embodiments, the user's settings as well as detailed diagnostic information is saved and uploaded to a server prior to shutting down the thermostat in step 1122. In step 1124, based on the diagnostics and other information, including other information received directly from the user, the user may be offered expert assistance to remedy the problem. In some cases this may include free technical assistance. In other cases, depending on the nature of the problem, an offer for paid expert service can be made. If the error is believed to be resolved in step 1126 the FET switches are re-enabled in step 1128. If it turns out that the error condition remains then the over current detection circuitry will again shut off the FETs, but there will be no resulting damage to the thermostat or other HVAC equipment.

Although the concepts of automated sensing of anomalous wiring conditions have been thus far described with respect to a thermostat, according to some embodiments these concepts are applicable beyond the immediate environment of HVAC to the smart home as a whole, as well as to network-based ecosystems and/or more generalized algorithmic paradigms within which the invention may be applicable. The concepts of automated sensing of an anomalous wiring condition combined with automated reporting of the detected condition, by means of an on-device user interface and/or communication over a data network can be applied in several contexts. These advantages can be even further enhanced when there is an automated limiting of the effects of the anomalous condition, and yet still further enhanced when there is a subsequent automated re-sensing or re-testing for the anomalous condition.

According to some embodiments, network-connected, microprocessor controlled irrigation controllers, in which an overcurrent condition on a control wire may be indicative of a stuck irrigation valve. The report goes to a cloud-based servicing system and recommendations, servicing hints, advertisements for superior irrigation valves, and/or automated ordering of replacement valves are then initiated. The cloud-based system can furthermore track the anomaly for that user, and can furthermore can track similar such anomalies across a population of users to detect patterns in the detected overcurrent conditions.

According to some other embodiments, network-connected, microprocessor controlled garage door openers, include sensing for an overcurrent condition on an input power wire may be indicative of an obstruction condition. Similar tracking and pattern detection can be achieved as described above for irrigation controllers. The current-limited switches are generally larger and more powerful then those described with respect to thermostats, since generally line voltages are used. The scope of the described embodiments can therefore extend to any network-connected, microprocessor controlled appliance, and in general to any network-connected, microprocessor controlled device that receives one or more control or power wires, many of which are shown and described with respect to FIG. 1 herein.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

What is claimed is:

1. A thermostat comprising:
   a switching circuit configured to operate in an on state and an off state, the switching circuit further configured to activate an HVAC function when switched to the on state;
   one or more processors; and
   a fault-protected driver chip configured to:
   monitor one or more electrical properties associated with the switching circuit;
   receive an enable signal from the one or more processors to activate the HVAC function;
   provide a drive signal to the switching circuit to cause the switching circuit to switch to the on state to activate the HVAC function;
   determine if an electrical anomaly associated with the switching circuit is present based at least in part on the monitored one or more electrical properties, wherein the electrical anomaly comprises an over-current or over-voltage anomaly;
   cause switching circuit to switch to the off state if an electrical anomaly is detected;
   provide a fault signal to the one or more processors;
   determine, while the switching circuit remains in the off state, if the electrical anomaly has been corrected; and
   subsequent to a determination that the anomaly has been corrected, cause the switching circuit to switch to the on state.

2. A thermostat according to claim 1, wherein the switching circuit comprises a first Field Effect Transistor (FET).

3. A thermostat according to claim 2, wherein the monitored one or more electrical properties includes a voltage level of a node associated with a drain of the first FET.

4. A thermostat according to claim 2, wherein the switching circuit comprises a second FET that is switched on and off with the first FET.

5. A thermostat according to claim 1, wherein the one or more processors are further programmed to determine if the electrical anomaly is caused by an anomalous wiring condition.

6. A thermostat according to claim 5, further comprising a user interface, wherein the one or more processors are further programmed to display an error message on the user interface indicating the anomalous wiring condition.

7. A thermostat according to claim 1, wherein the fault-protected driver chip electrically isolates the one or more processors from a 24 VAC voltage line of an HVAC system.

8. A thermostat according to claim 1, wherein the fault-protected driver chip is powered by a differential clock signal from the one or more processors.

9. A thermostat according to claim 1, wherein the electrical anomaly comprises a voltage level surpassing a threshold voltage that indicates excessive current in the switching circuit.

10. A thermostat according to claim 1, wherein the one or more processors comprises a backplate microprocessor that communicates with a head unit microprocessor.

11. A thermostat according to claim 1, wherein the thermostat further comprises a wireless communication module configured to communicate with a cloud-based thermostat management server.

* * * * *